US010311169B1

(12) United States Patent
Leedom et al.

(10) Patent No.: US 10,311,169 B1
(45) Date of Patent: Jun. 4, 2019

(54) INTERACTIVE EDGE MANIPULATION SYSTEMS AND METHODS

(71) Applicant: MSC.Software Corporation, Santa Ana, CA (US)

(72) Inventors: James Harvey Leedom, Columbus, NJ (US); Frank Mueller, Newport Beach, CA (US); Michel Samah, Costa Mesa, CA (US)

(73) Assignee: MSC.Software Corporation, Newport Beach, CA (US)

( * ) Notice: Subject to any disclaimer, the term of this patent is extended or adjusted under 35 U.S.C. 154(b) by 410 days.

(21) Appl. No.: 13/673,905

(22) Filed: Nov. 9, 2012

(51) Int. Cl.
G06F 17/50 (2006.01)
(52) U.S. Cl.
CPC ................ G06F 17/5009 (2013.01)
(58) Field of Classification Search
CPC ..... G06F 17/5009; G06F 17/50; G06T 19/00; G06T 17/20
USPC .......................... 703/1, 2; 345/419, 420, 619
See application file for complete search history.

(56) References Cited

U.S. PATENT DOCUMENTS

| | | | | |
|---|---|---|---|---|
| 5,265,197 A * | 11/1993 | Kondo | | 345/420 |
| 5,377,118 A * | 12/1994 | Leon et al. | | 700/182 |
| 5,655,063 A * | 8/1997 | Crocker | | G06T 17/00 |
| | | | | 345/420 |
| 5,886,702 A * | 3/1999 | Migdal | | G06T 17/20 |
| | | | | 345/423 |
| 6,031,548 A * | 2/2000 | Gueziec | | G06T 17/20 |
| | | | | 345/440 |
| 6,262,737 B1 * | 7/2001 | Li | | G06T 17/20 |
| | | | | 345/419 |
| 6,373,489 B1 * | 4/2002 | Lu et al. | | 345/428 |
| 6,630,932 B1 * | 10/2003 | Grzeszczuk | | G06T 17/10 |
| | | | | 345/420 |
| 6,996,505 B1 * | 2/2006 | Edelsbrunner | | G06T 17/205 |
| | | | | 345/419 |
| 8,004,517 B1 * | 8/2011 | Edelsbrunner | | G06T 17/20 |
| | | | | 345/419 |
| 9,607,422 B1 * | 3/2017 | Leedom | | G06T 15/00 |
| 2002/0167518 A1 * | 11/2002 | Migdal | | G06T 17/20 |
| | | | | 345/428 |
| 2003/0065487 A1 * | 4/2003 | Rosel | | G06T 11/203 |
| | | | | 703/1 |
| 2004/0046769 A1 * | 3/2004 | Arvin et al. | | 345/619 |
| 2005/0052452 A1 * | 3/2005 | Baumberg | | G06T 7/0067 |
| | | | | 345/419 |
| 2005/0116949 A1 * | 6/2005 | Hoppe | | 345/423 |
| 2011/0061034 A1 * | 3/2011 | Ginetti | | G06F 17/5068 |
| | | | | 716/104 |

(Continued)

OTHER PUBLICATIONS

IC Station Users Manual, Software Version v8.9-9, IC Flow Version 2003.1, Mentor Graphics Corporation, 2003, 791 pages.*

(Continued)

Primary Examiner — Eunhee Kim
(74) Attorney, Agent, or Firm — Foley & Lardner LLP

(57) ABSTRACT

A method for simulating a physical object includes receiving user input to move an edge or plane of a simulated surface from a first location to a second location that is across an edge of the surface. The method also includes generating a visual display that is configured to inform the user that the movement of an edge to the second location across an edge of the surface is unpermitted.

25 Claims, 43 Drawing Sheets

(56) References Cited

U.S. PATENT DOCUMENTS

2012/0173208 A1* 7/2012 Houdouin ............... G06F 17/50
703/1

OTHER PUBLICATIONS

Kim HS, Choi HK, Lee KH. Mesh simplification with vertex color. In Advances in Geometric Modeling and Processing Jan. 1, 2008 (pp. 258-271). Springer Berlin Heidelberg.*

* cited by examiner

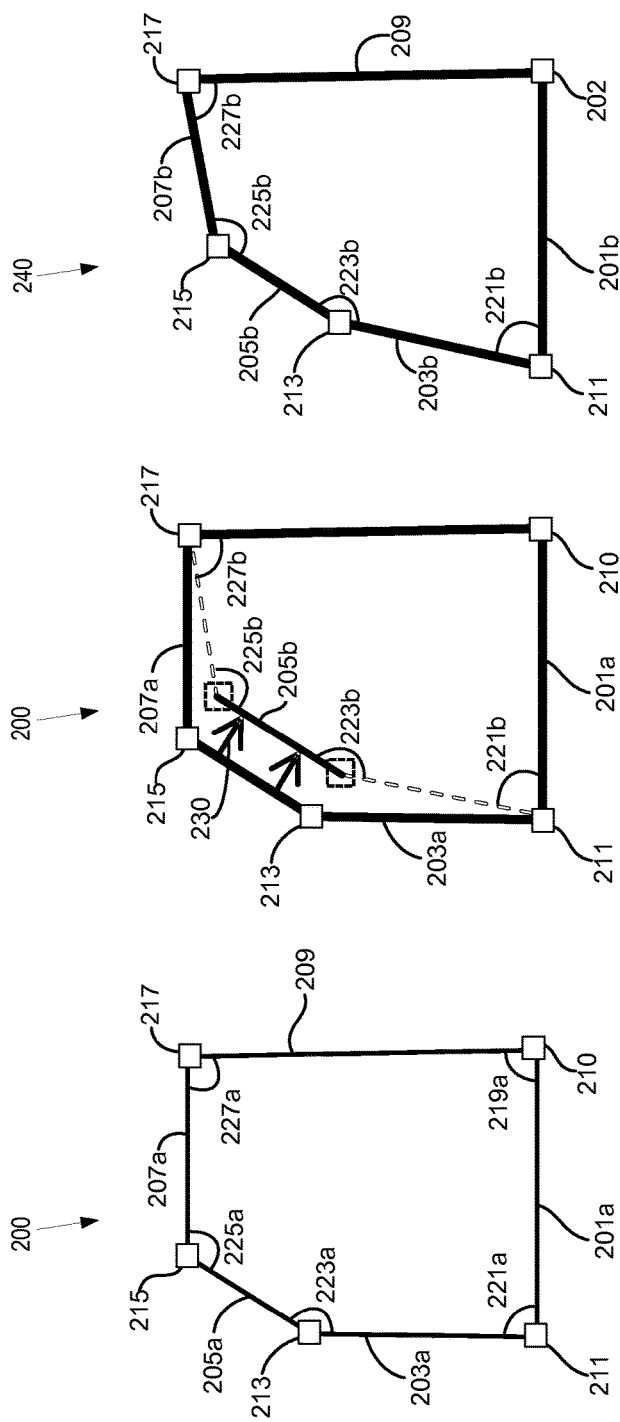

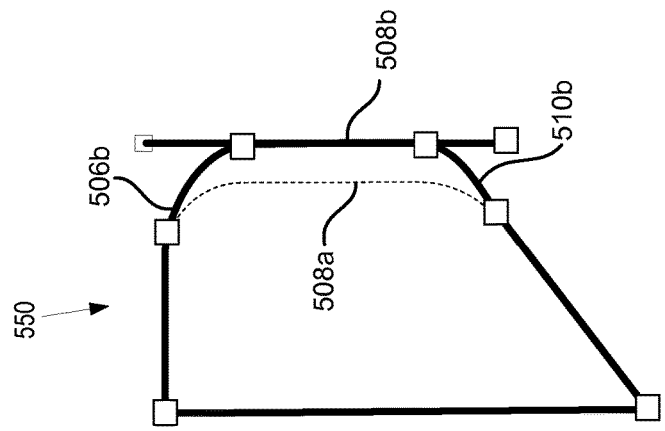
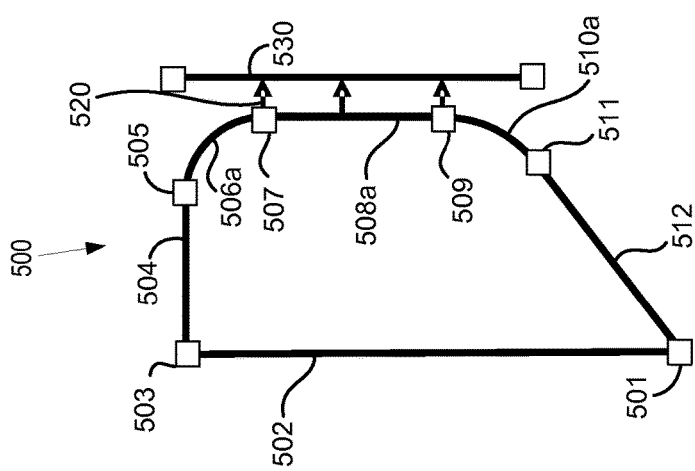

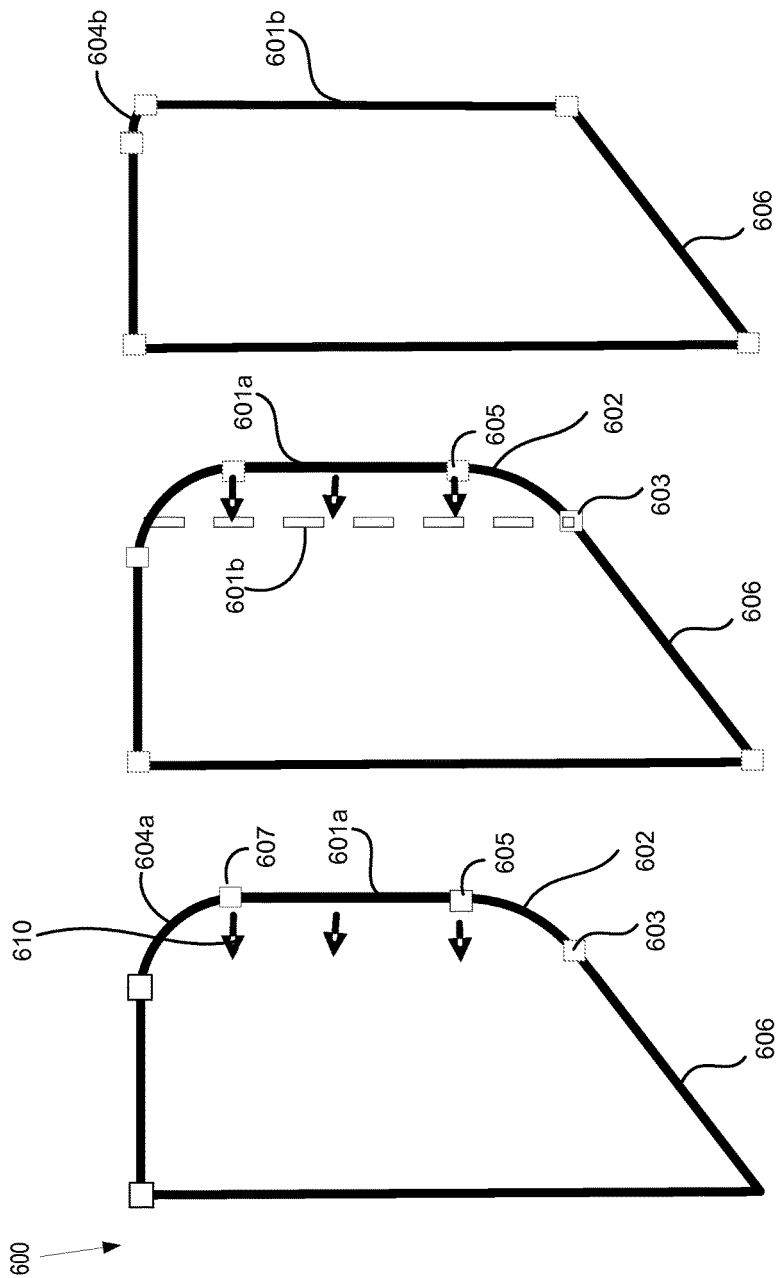

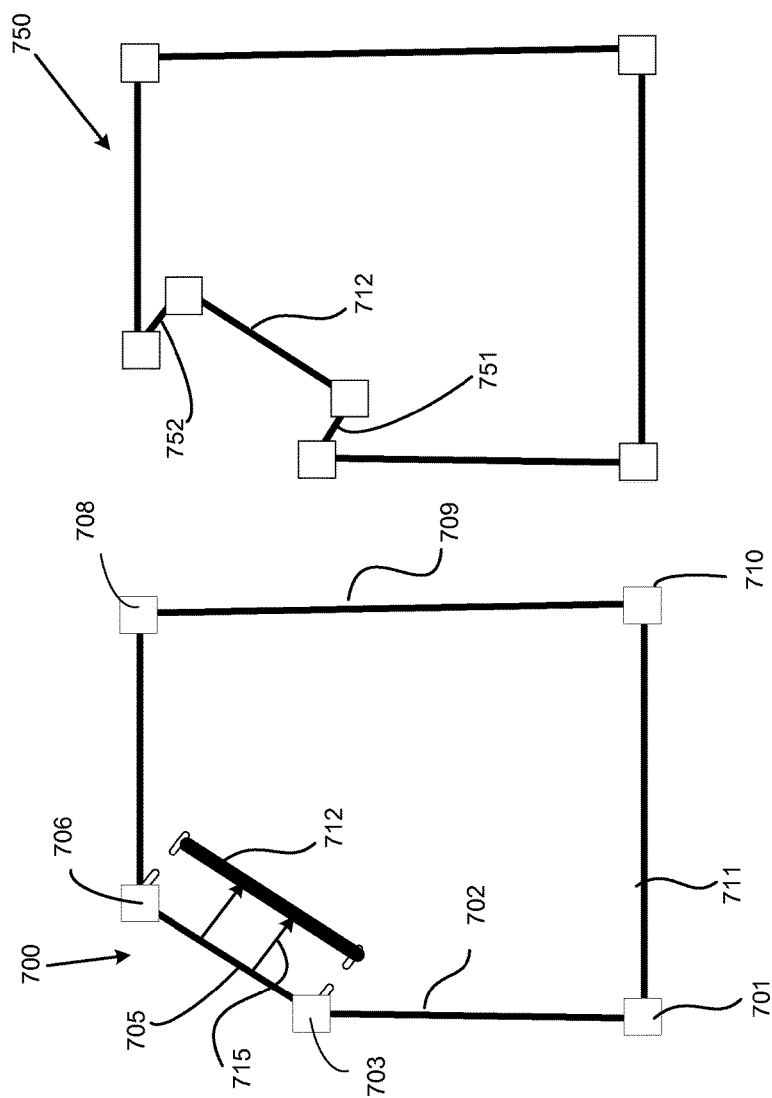

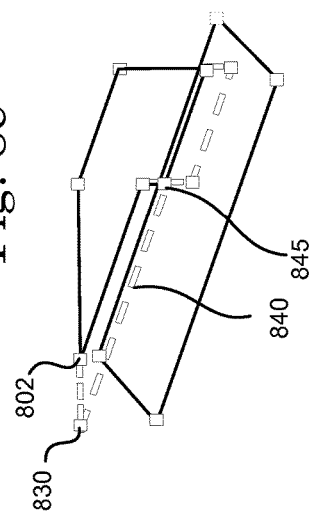
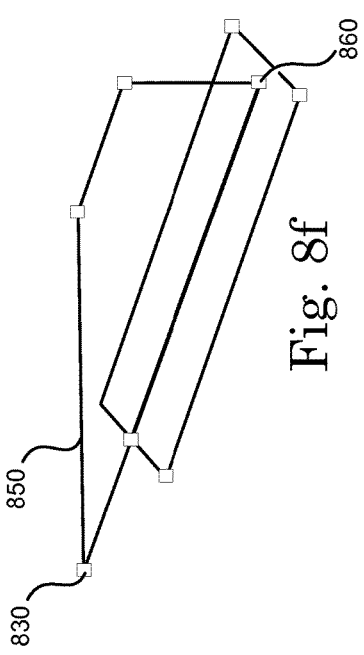
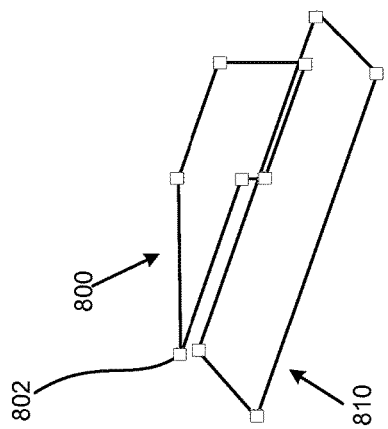

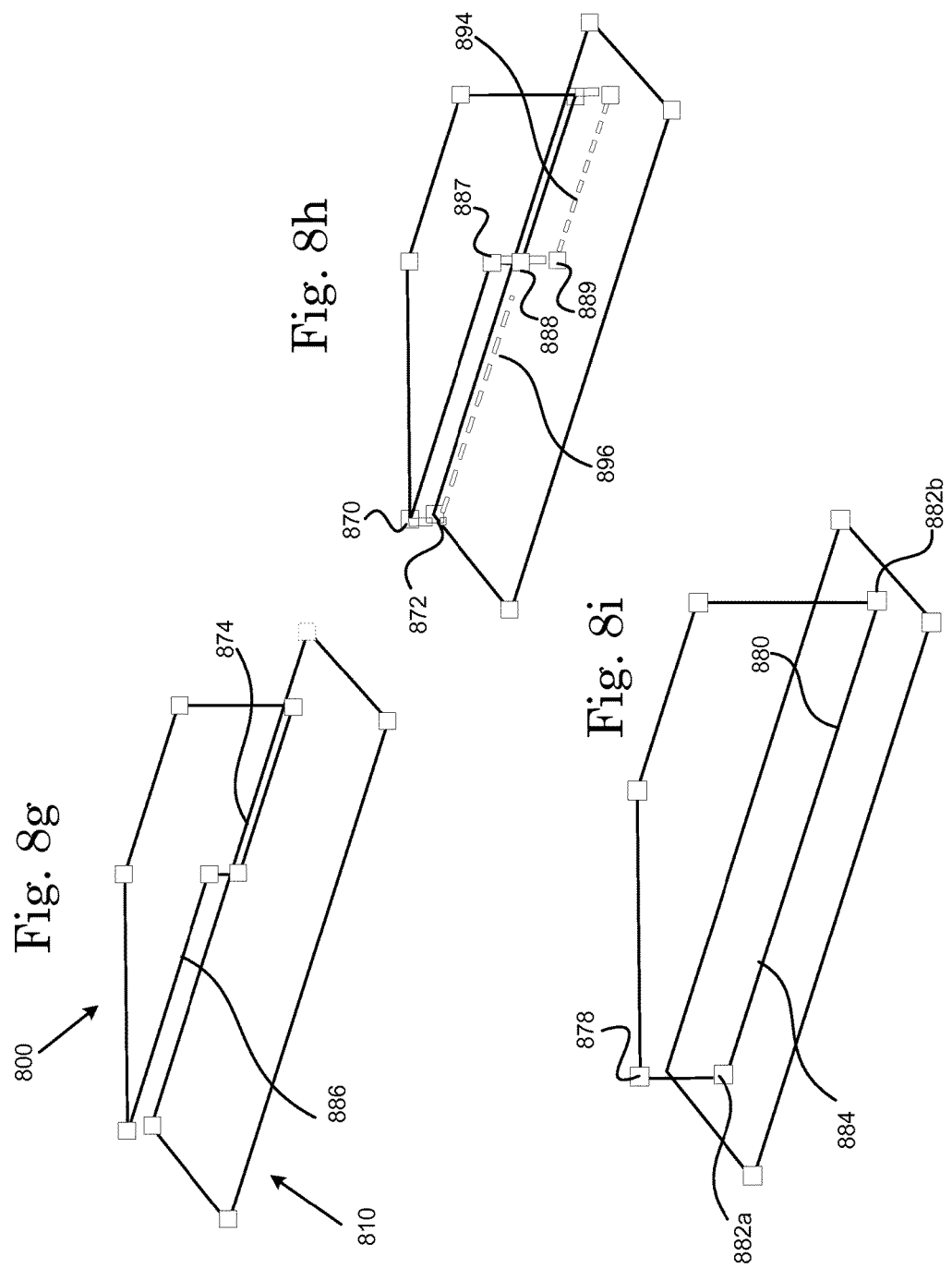

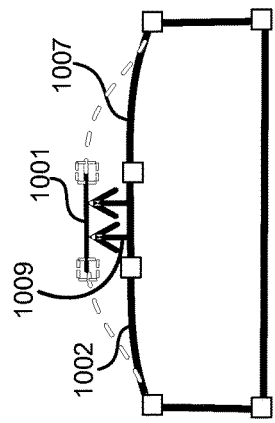
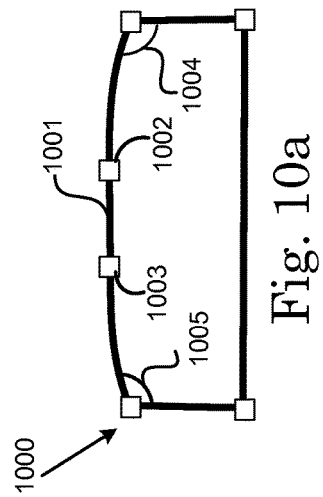
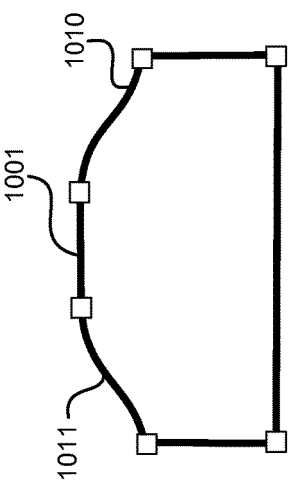
Fig. 10a
Fig. 10b
Fig. 10c

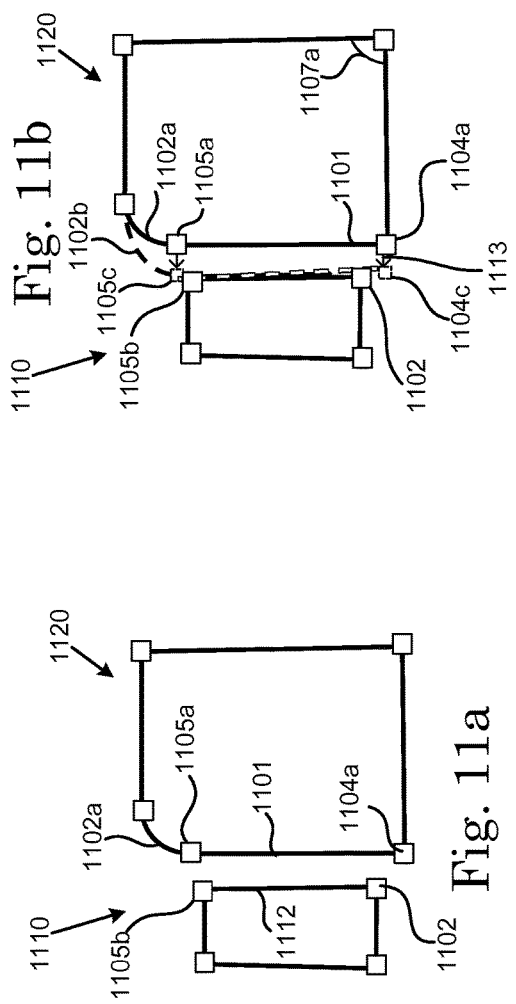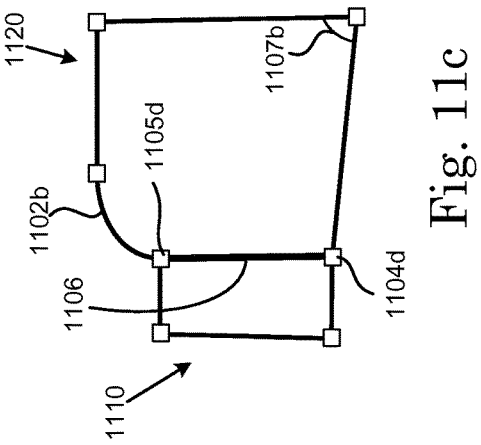

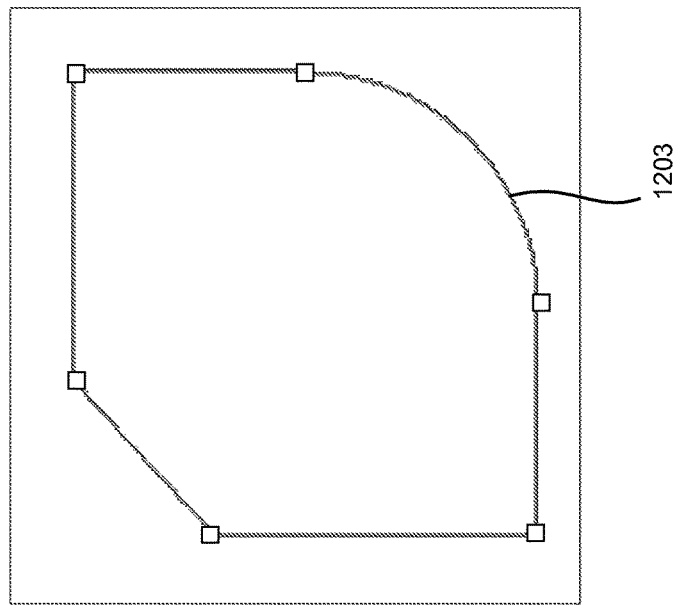
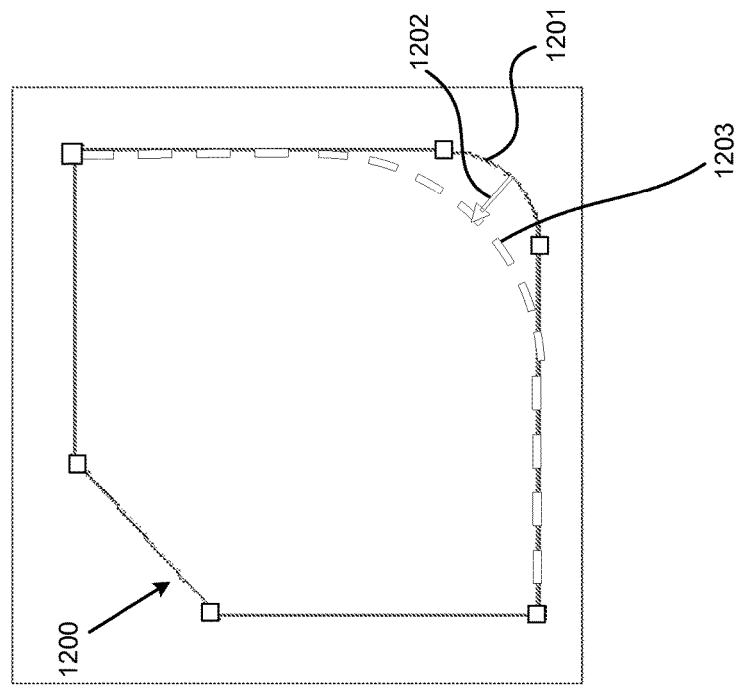
Fig. 12b
Fig. 12a

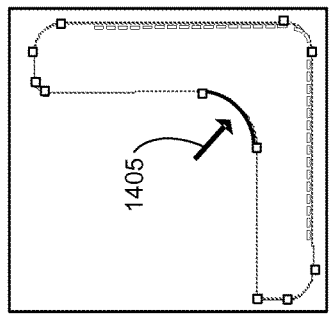
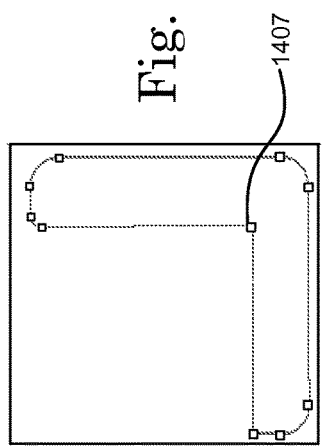
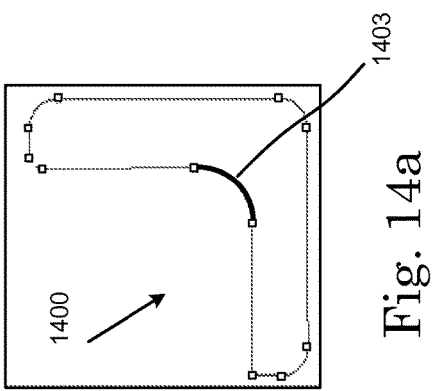

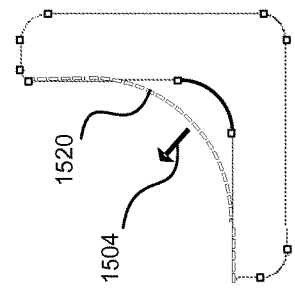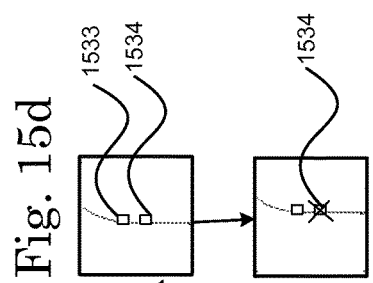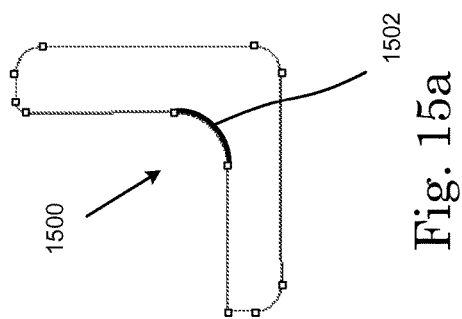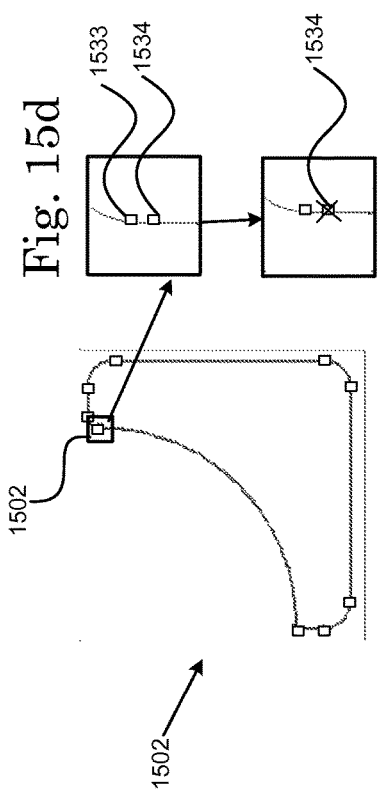

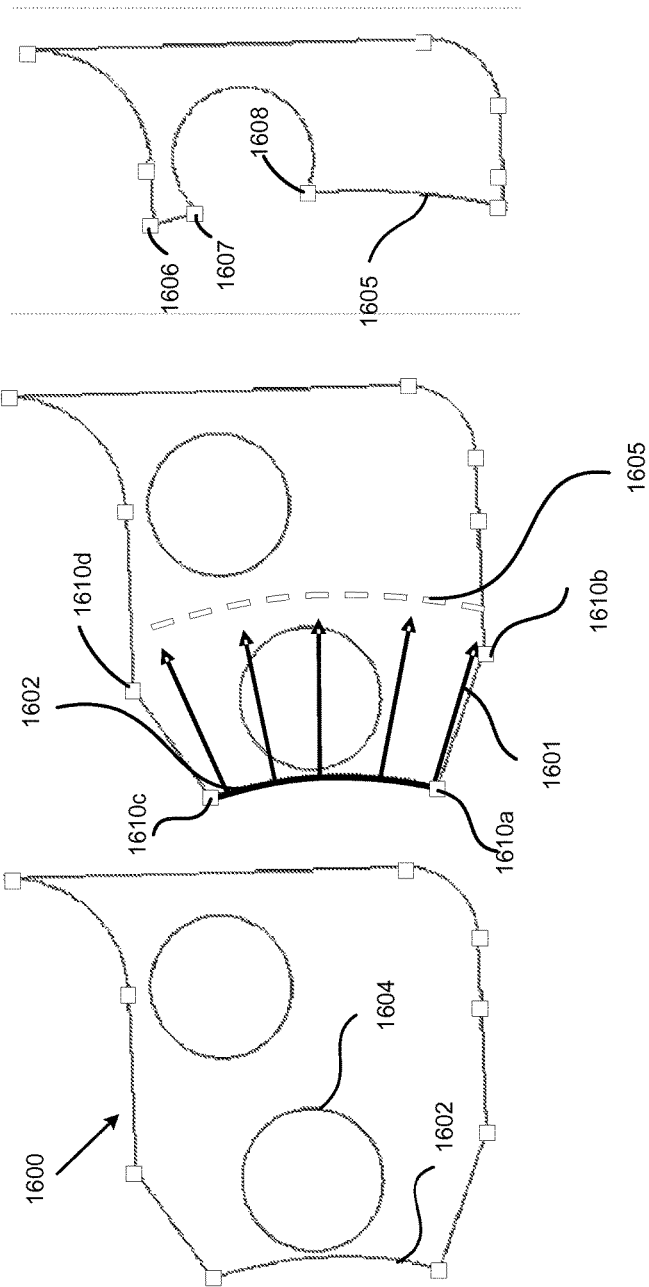

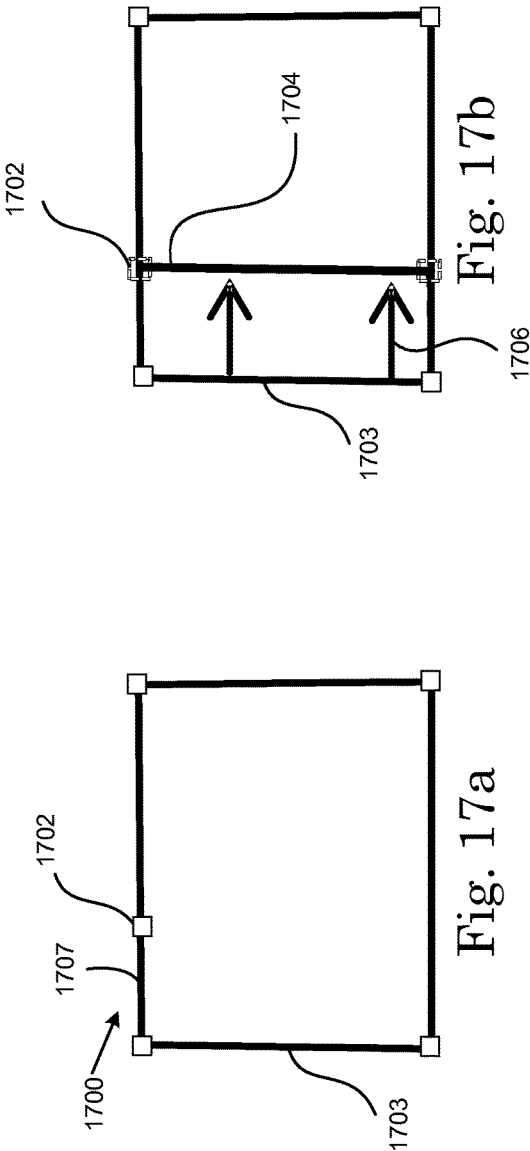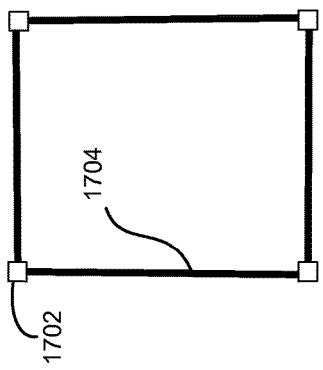

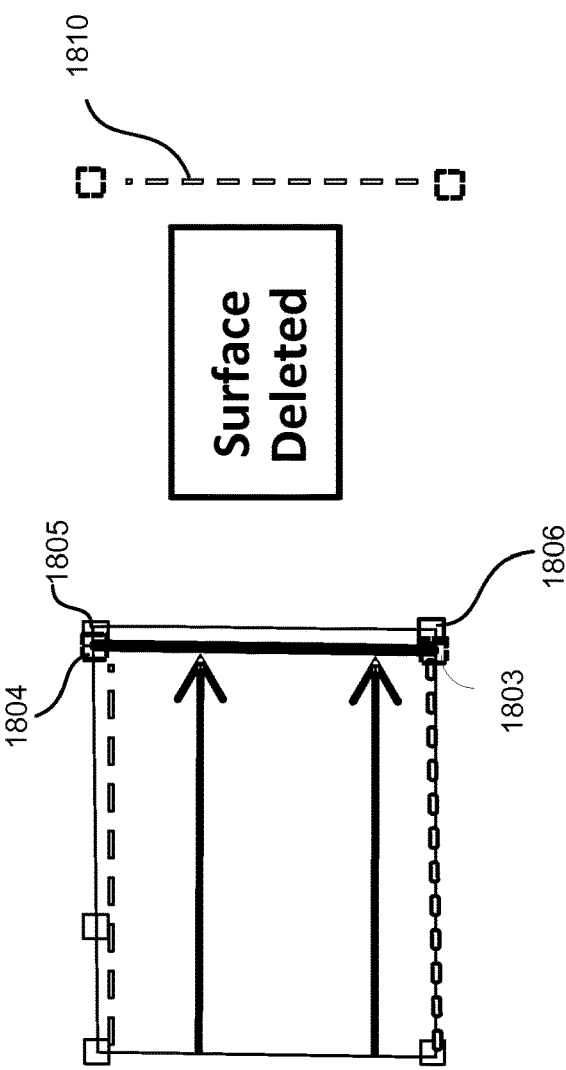
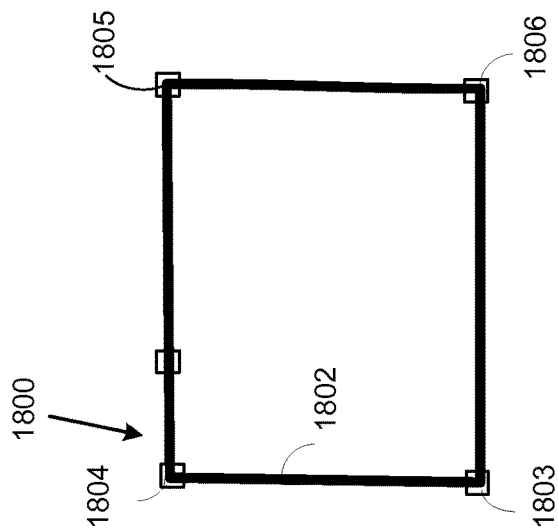
Fig. 18c    Fig. 18b    Fig. 18a

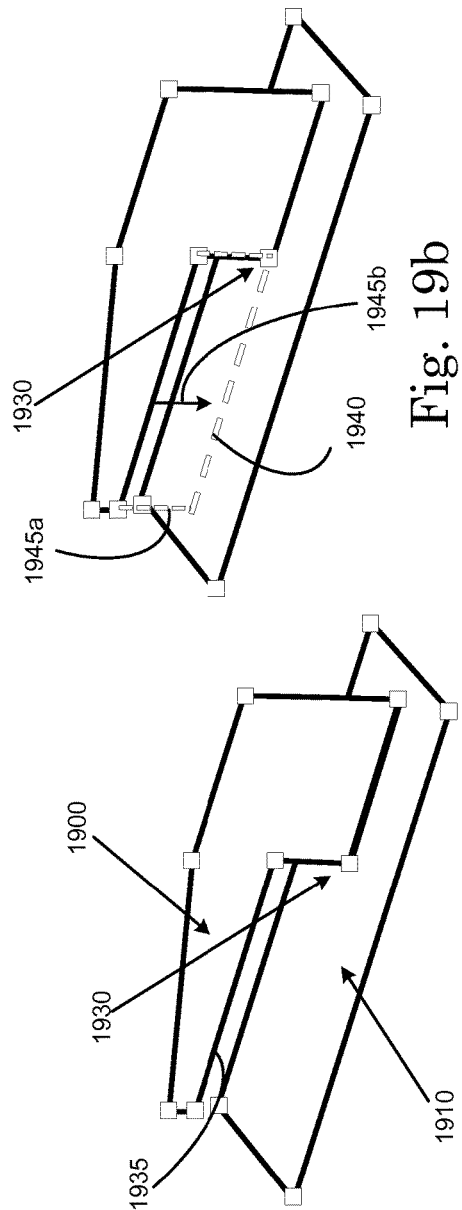
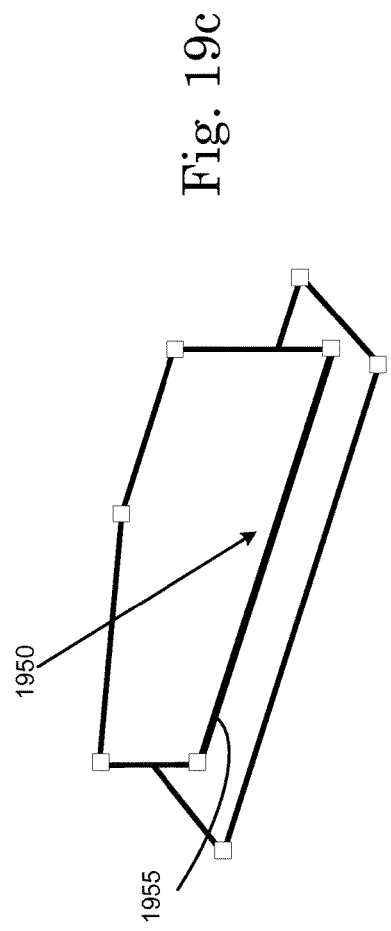
Fig. 19a
Fig. 19b
Fig. 19c

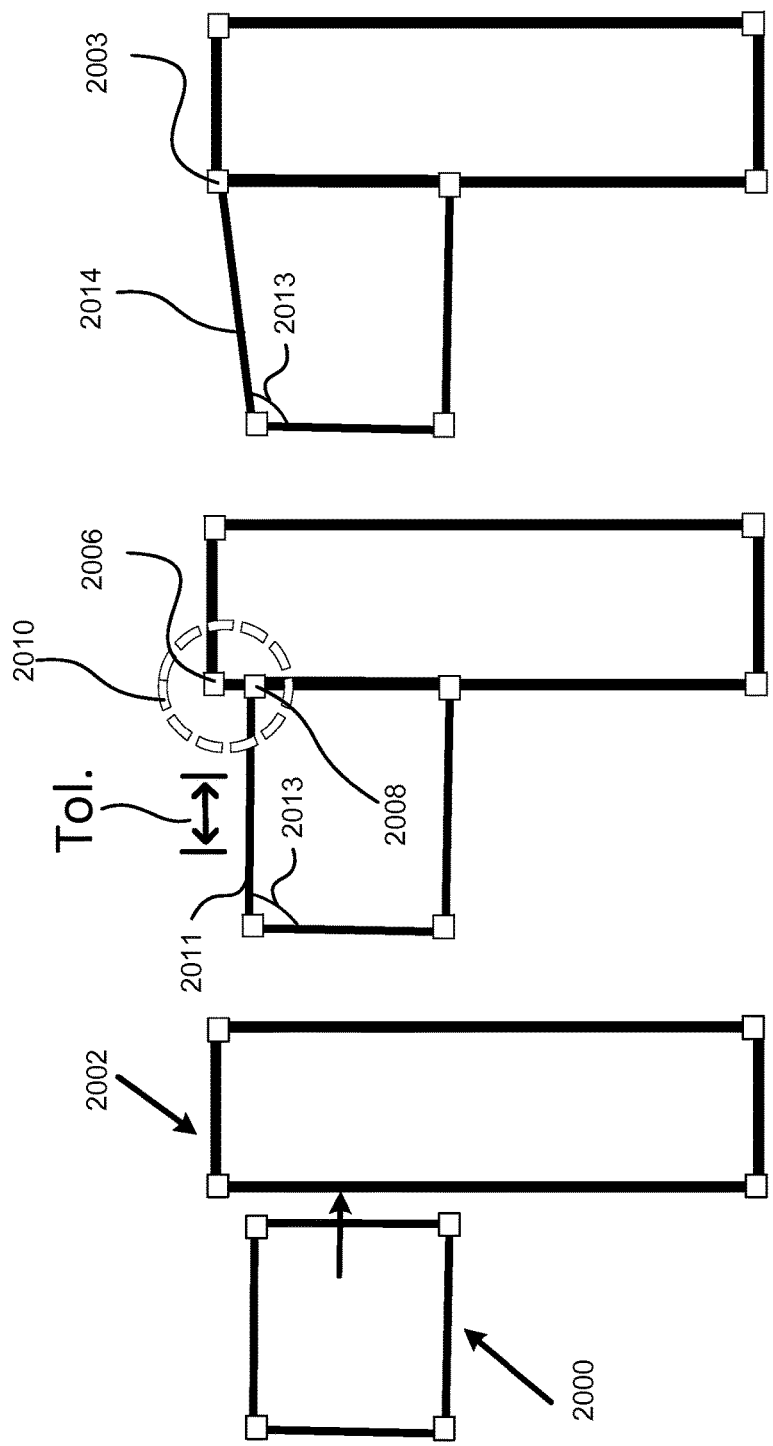

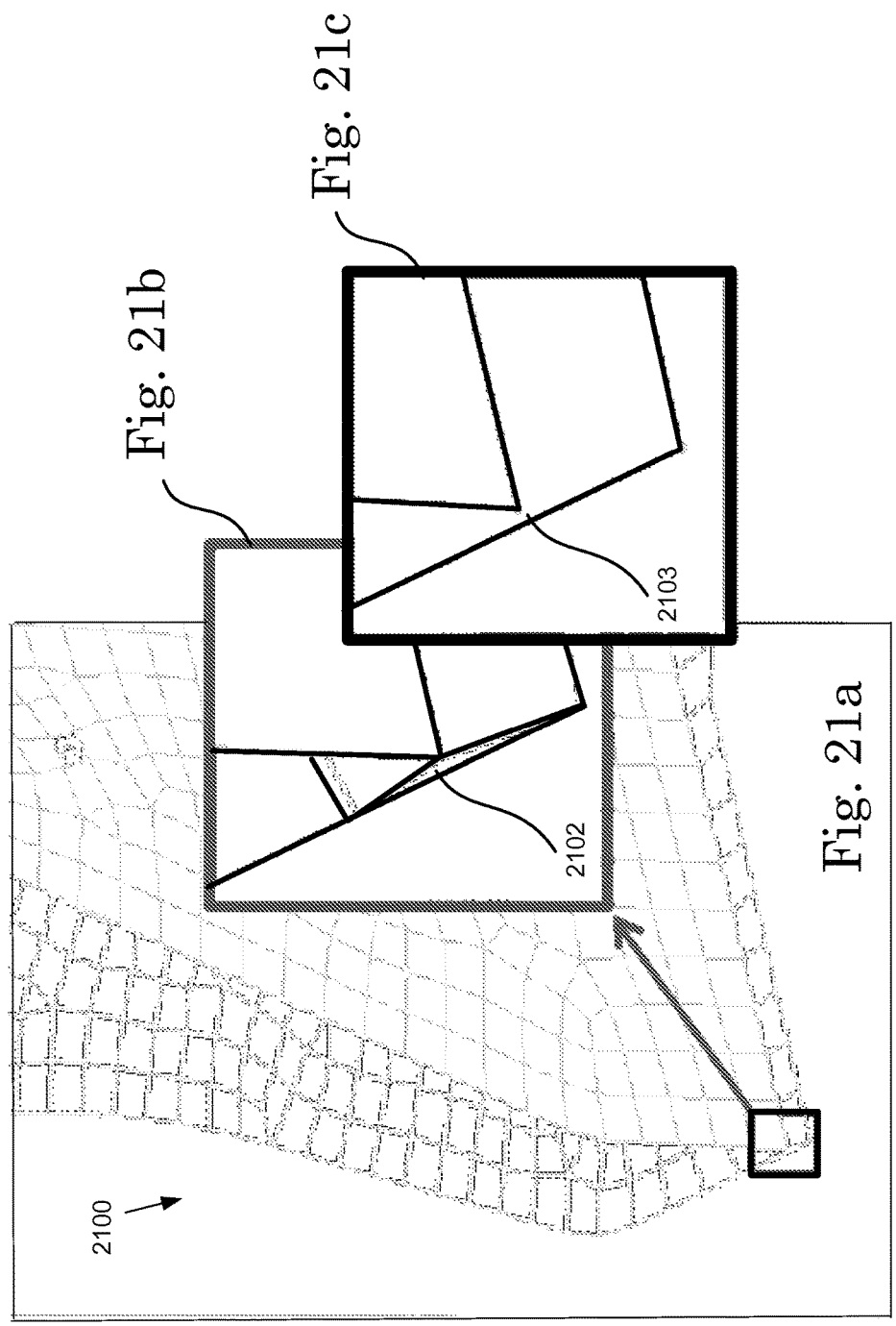

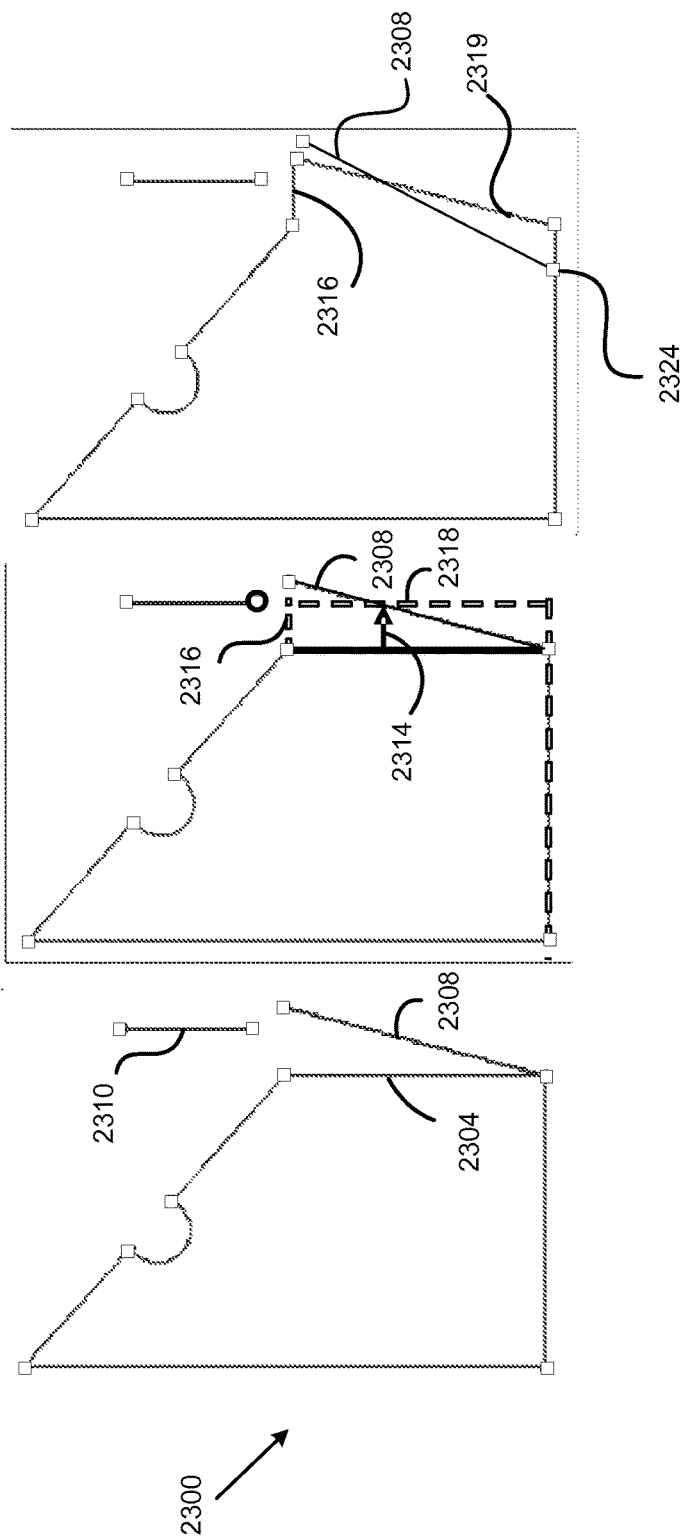

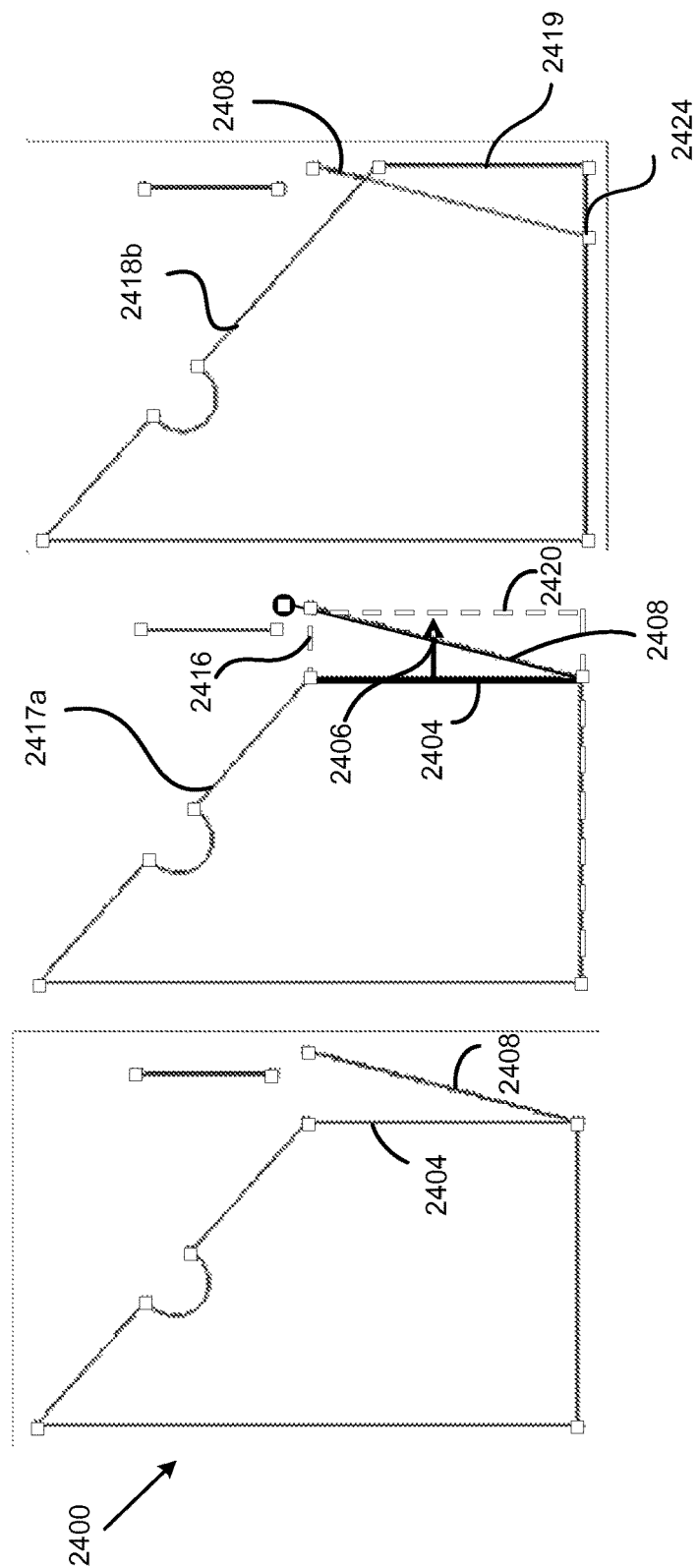

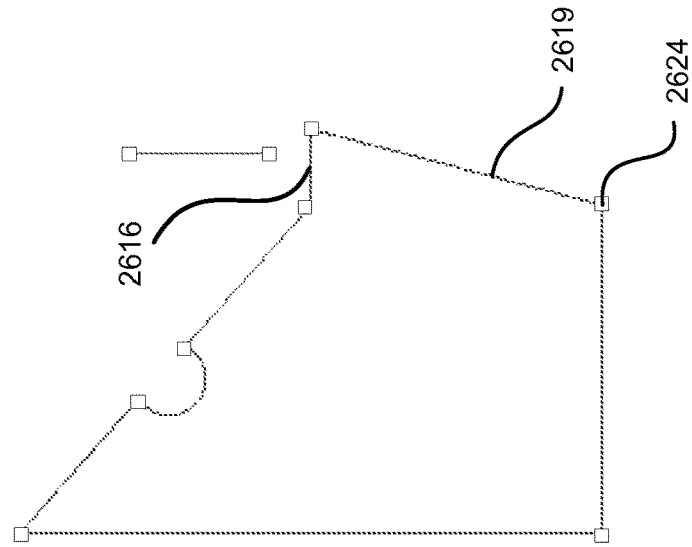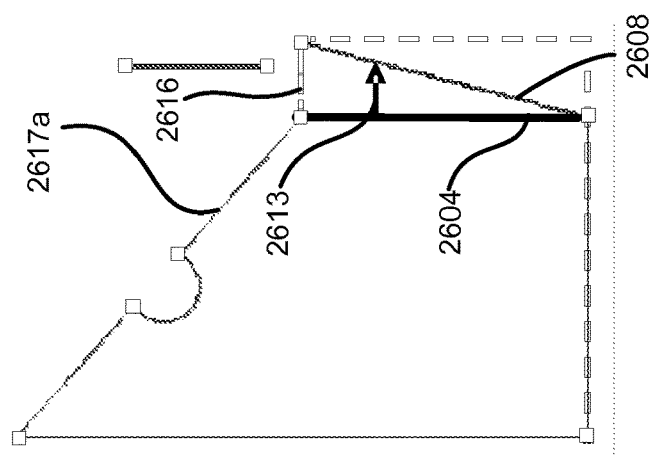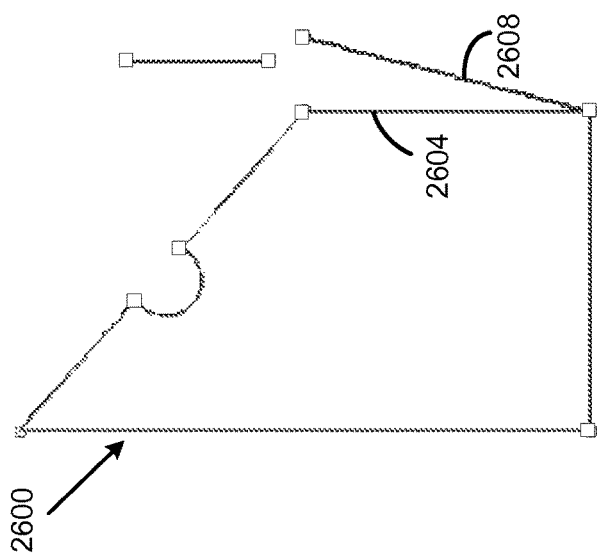

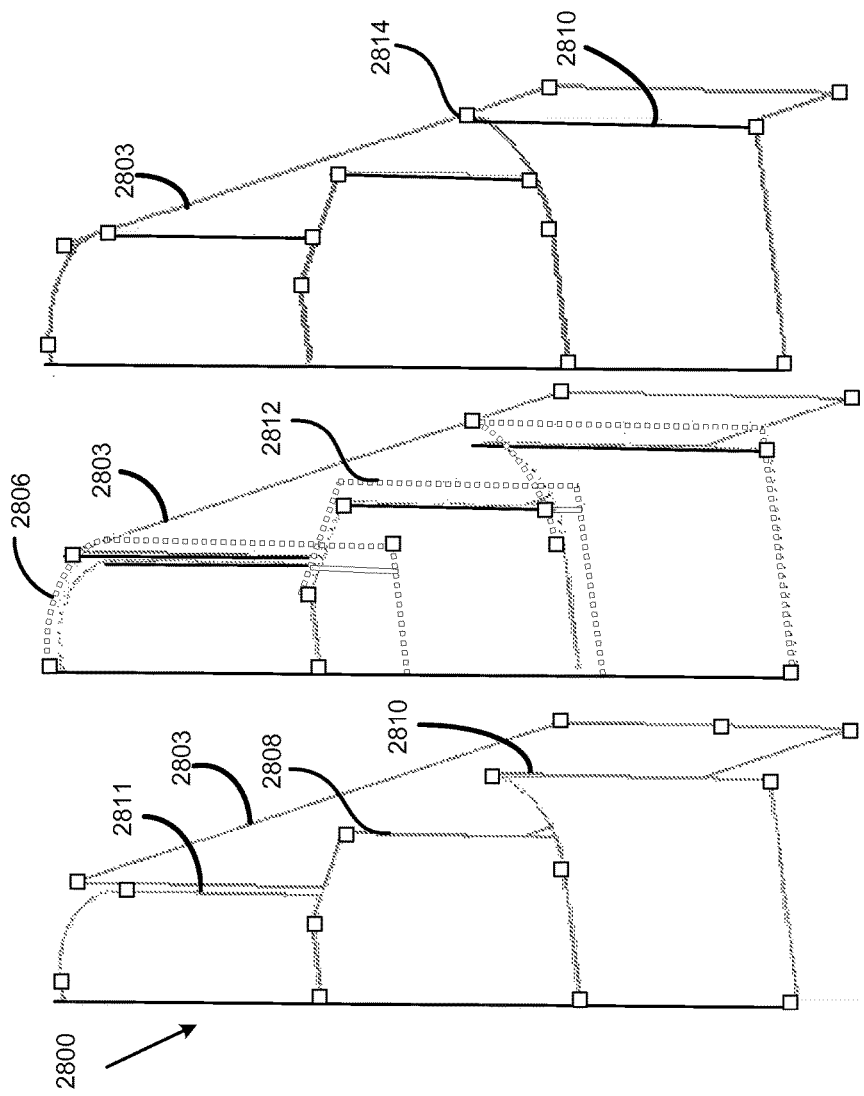

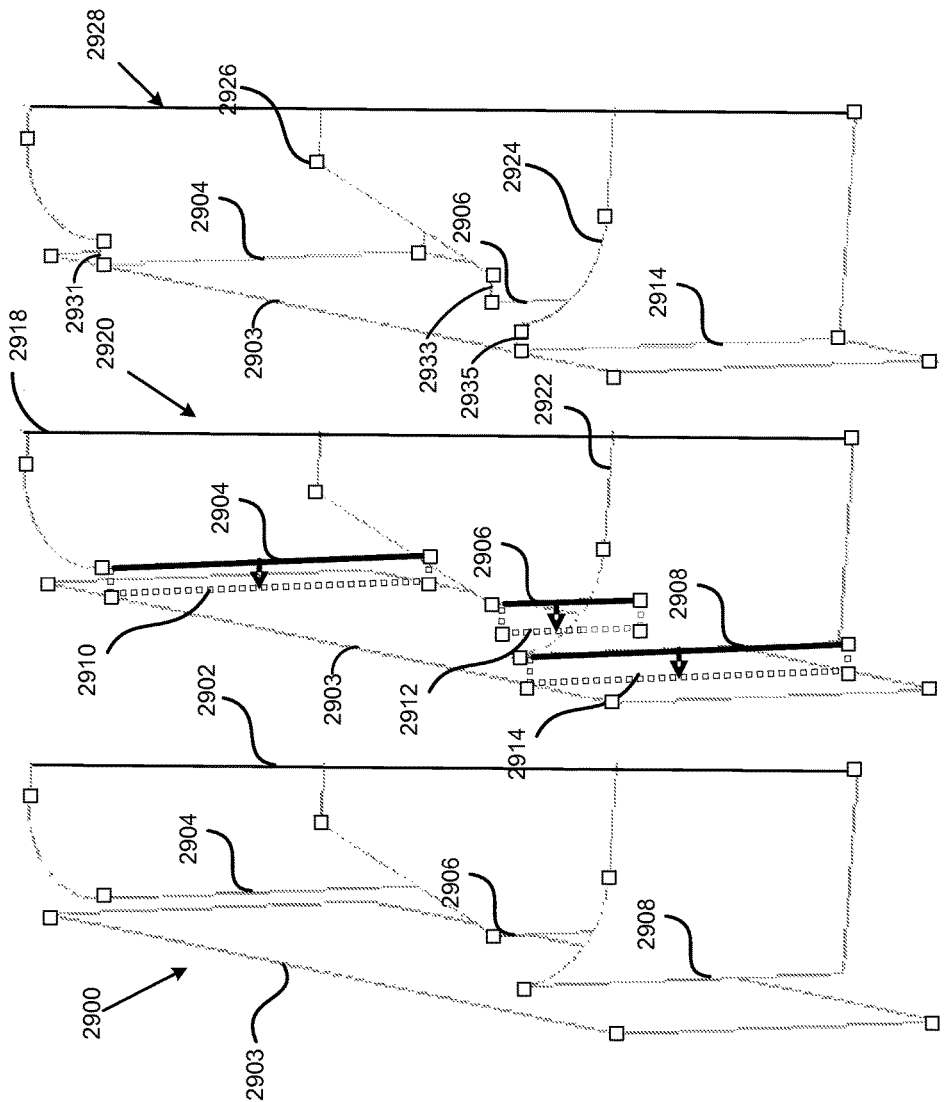

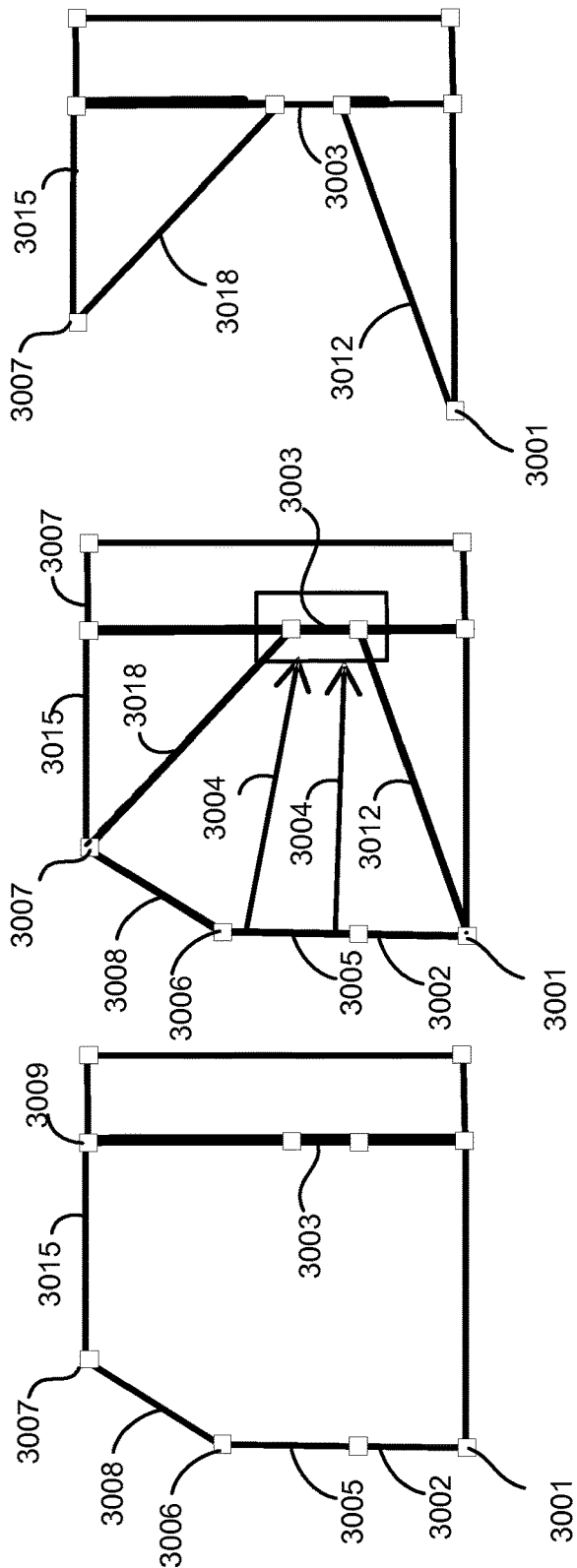

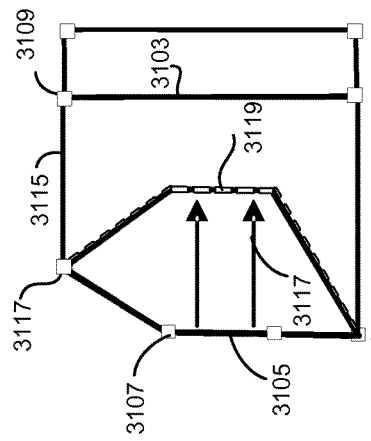
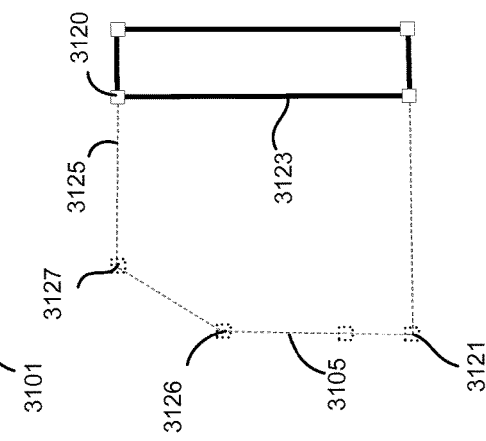
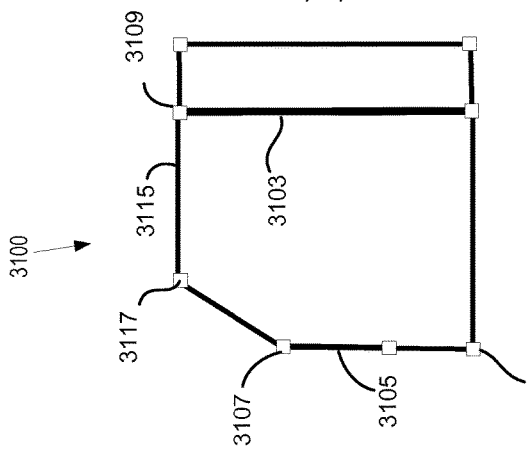
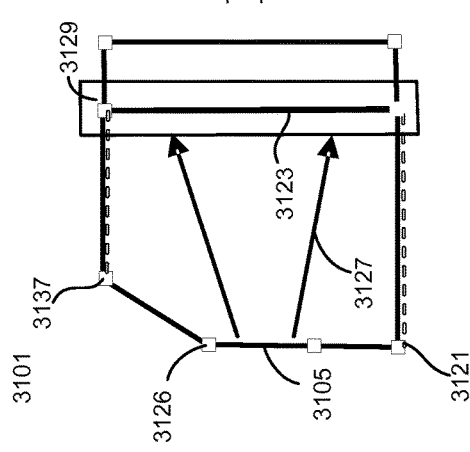

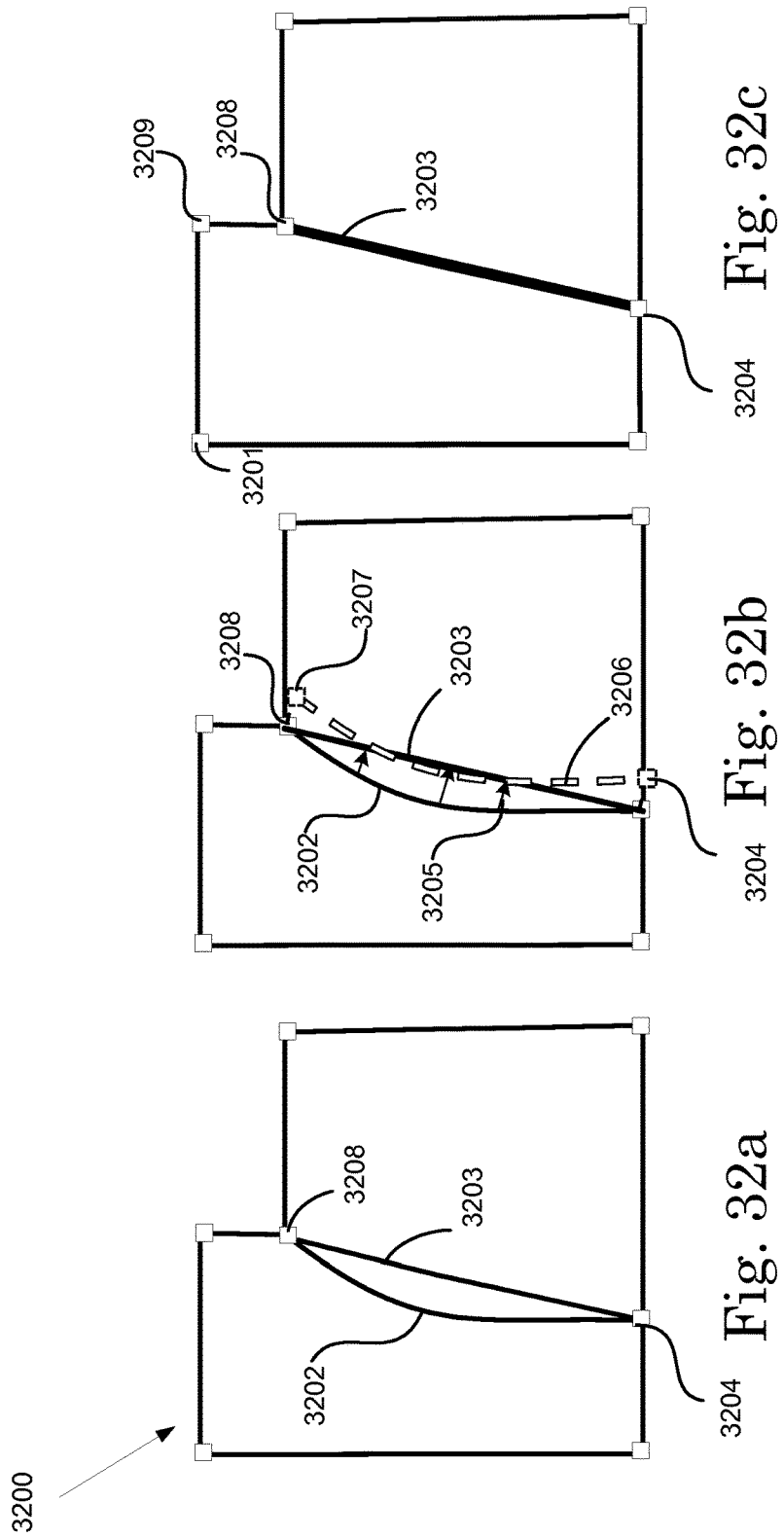

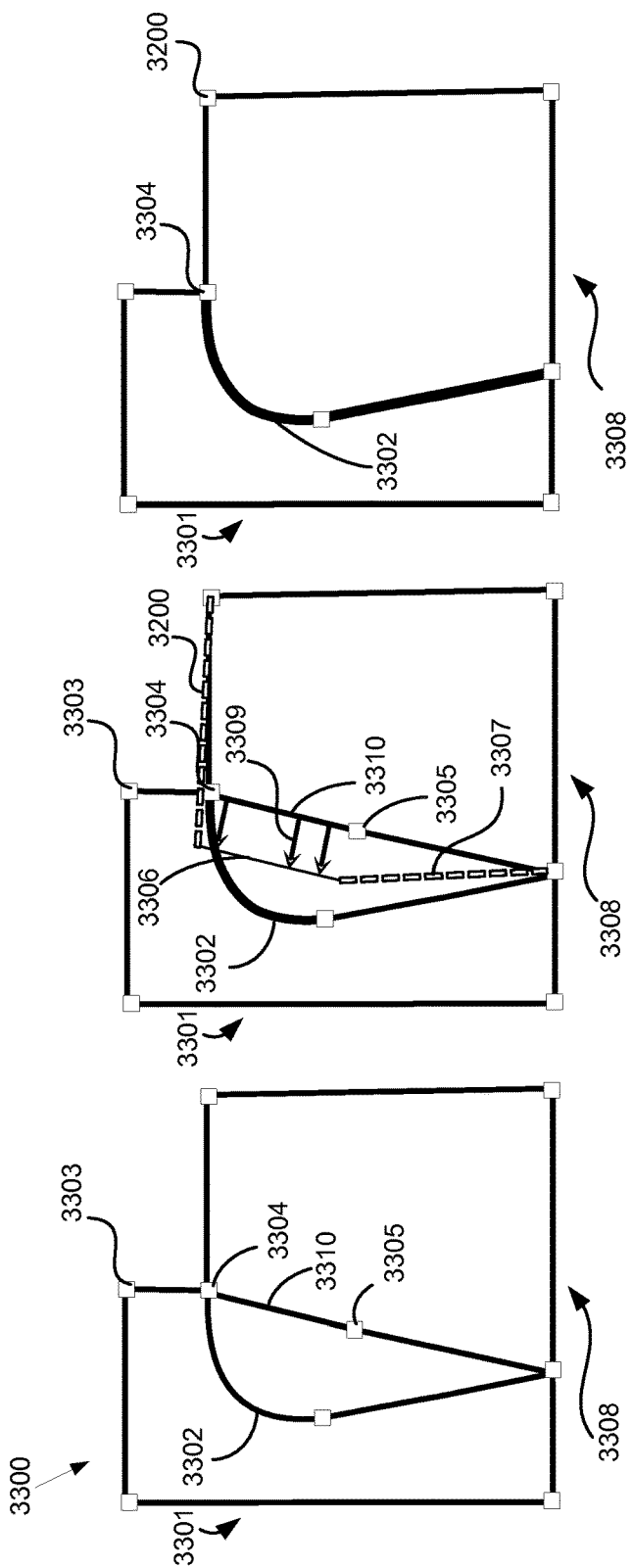

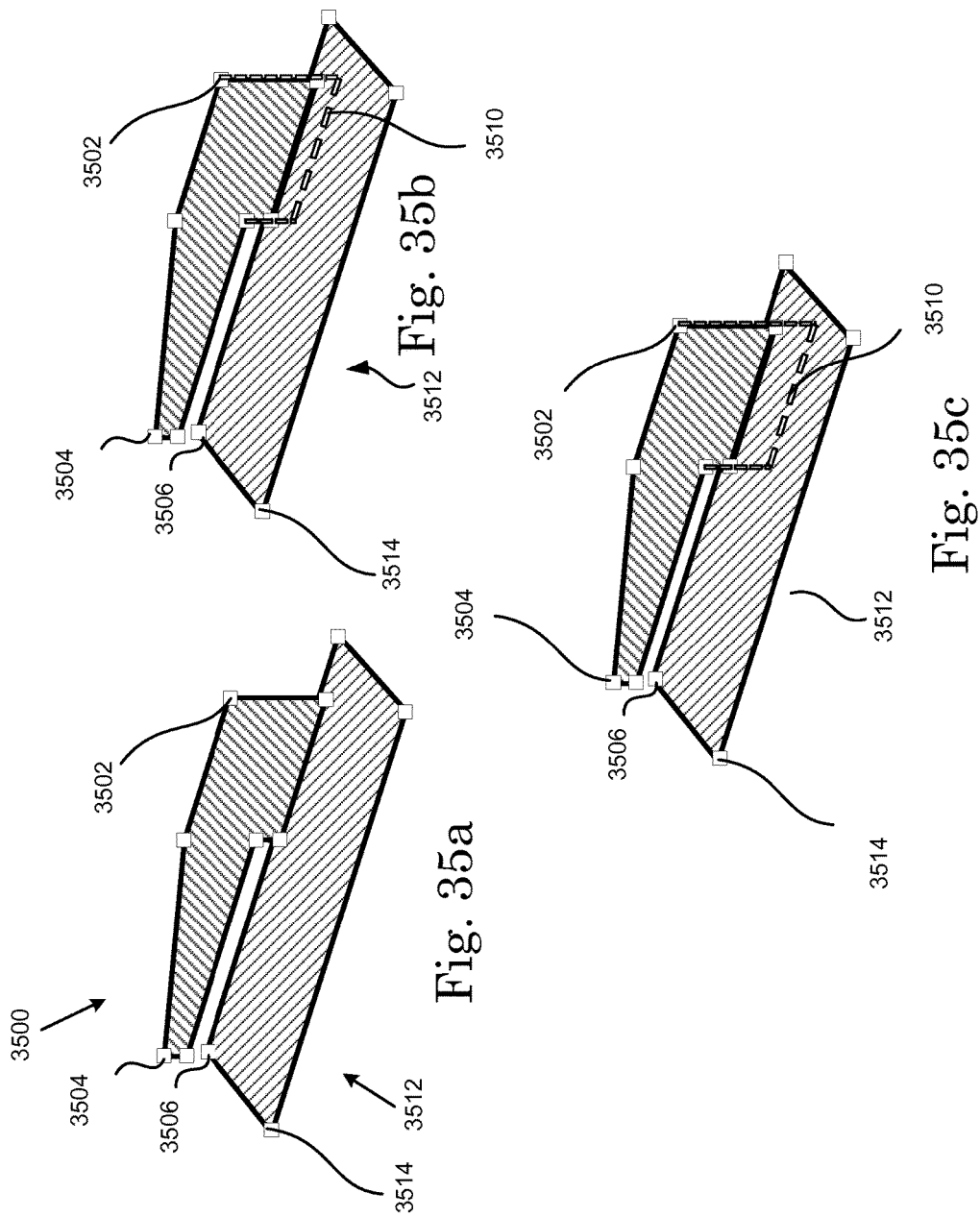

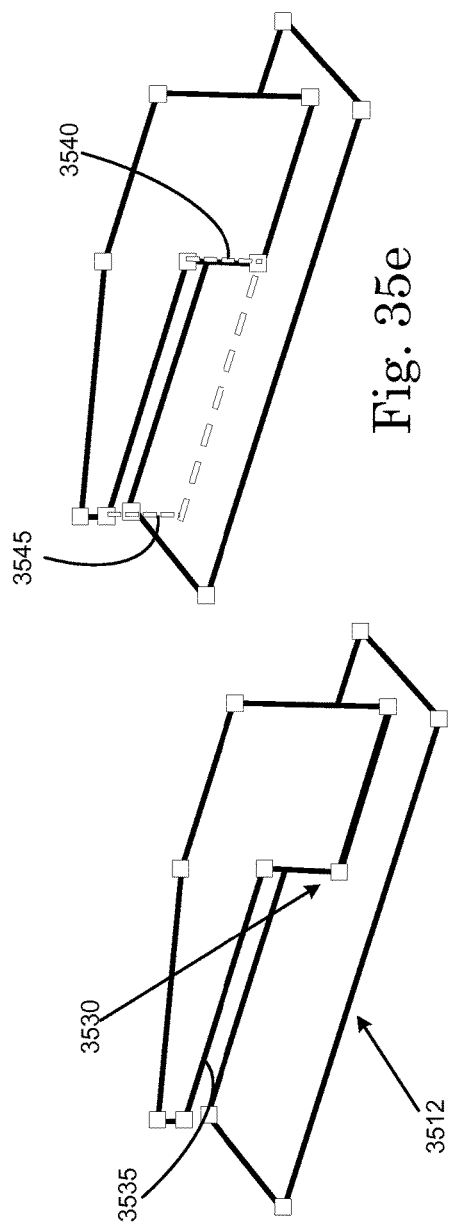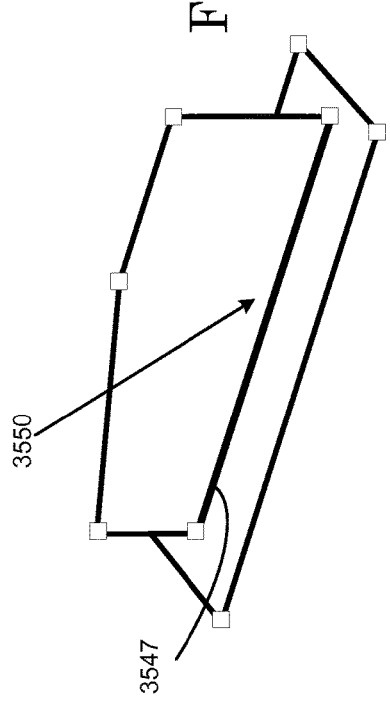

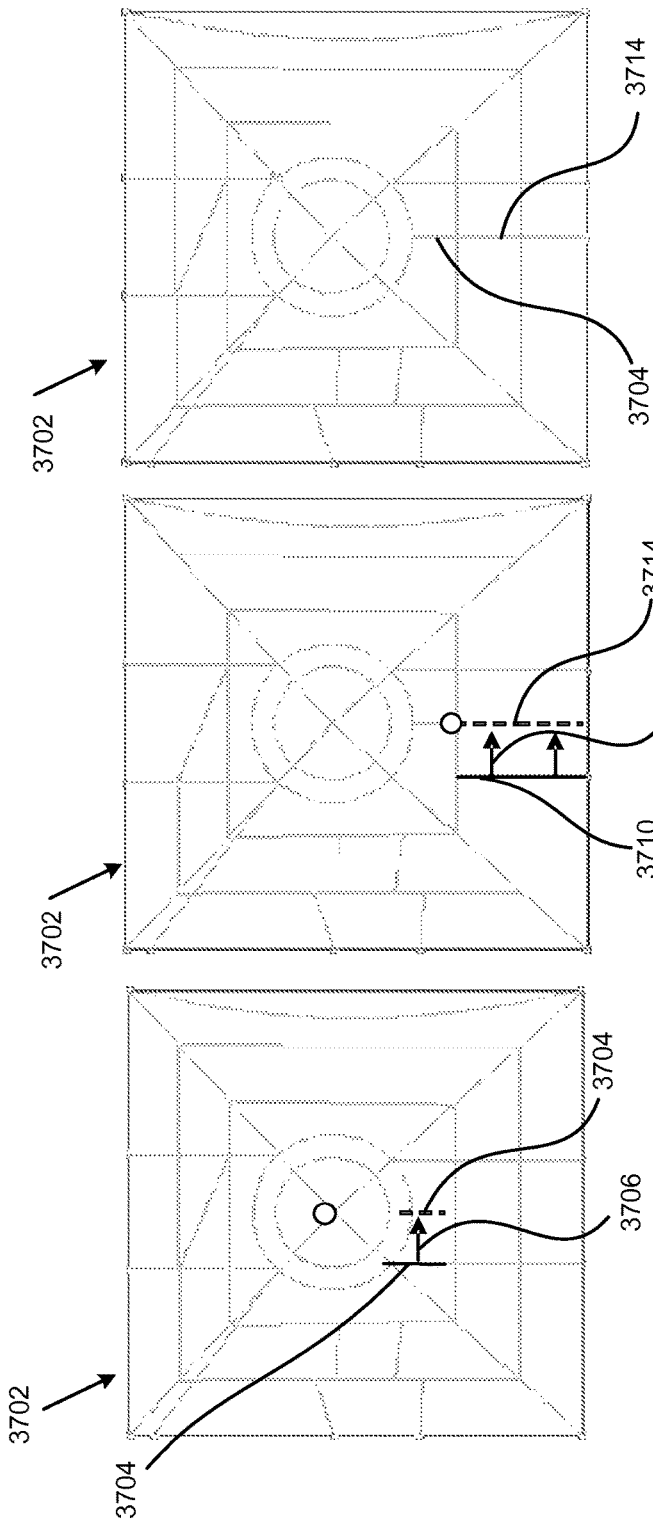

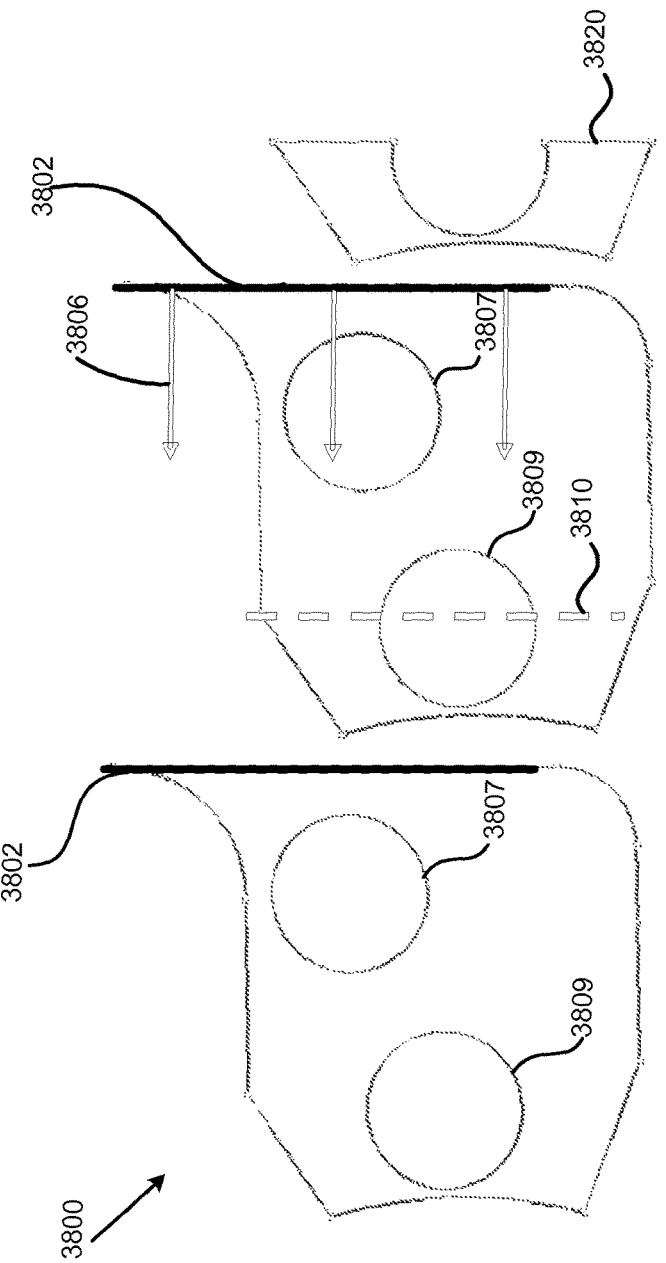

INTERACTIVE EDGE MANIPULATION SYSTEMS AND METHODS

BACKGROUND

Manufacturing complex systems and products includes creating computer-aided engineering (CAE) models and conducting tests on the models to determine their performance prior to manufacturing the model. Generating a functional model is a time-consuming process and reducing the amount of time for creating or repairing a model can be beneficial.

During the CAE geometry modeling process, a user may adjust surface boundaries using a plurality of tools. Users adjust the geometry, vertices, edges or surfaces during idealization or mid-surfacing, or adjust the geometric topology for mesh control. A plurality of tools can correct the geometric errors and aberrations. Various embodiments are directed to the creation of computer models of physical objects.

SUMMARY OF THE DISCLOSURE

Embodiments of interactive simulation and solver are directed to a system that includes a edge manipulation system that is configured to receive user input to move a selected edge of a surface that is part of a simulated object and a collapse system that is configured to determine an area of the surface and remove all attributes of the surface of the simulated object as the area of the surface approaches zero.

Embodiments of the interactive simulation environment includes a method for simulating a physical object by receiving user input to move an edge of a simulated surface from a first location to a second location that is across an edge of the surface. The method also includes generating a visual display that is configured to inform the user that the movement of an edge to the second location across an edge of the surface is unpermitted.

Embodiments described herein include a set of behaviors between user inputs supplied to the system as mouse or other pointing devices. Embodiments also include geometry and topology entities that collectively make up the 3D CAD or geometric model. The graphical display of the CAD geometry model, visual feedback and manipulation handles.

BRIEF DESCRIPTION

FIGS. 2a-2c are a sequence of displays that illustrate an example edge drag behavior.

FIGS. 5a and 5b are a sequence of displays that illustrate a surface with curved edges that cannot be extrapolated but may be stretched outward similar to the straight edges that were extrapolated in FIGS. 4a and 4b.

FIGS. 6a-6c are a sequence of displays that illustrate the extrapolate method to edit the surface from FIG. 5a to reduce the size of the surface.

FIGS. 7a and 7b are a sequence of displays that illustrate an extrusion feature where the edge is moved rigidly as shown in FIG. 7a.

FIGS. 8a-8i are a sequence of displays that illustrate using all three methods to extend a surface onto the surface below it. 8a-8c show the solution using Stretch mode, 8d-f show a sequence using extrapolate mode, and 8g-8i show the solution solved by the extrude mode. They are placed together to invite direct comparison.

FIGS. 10a-10c are a sequence of displays that illustrate the curved adjacent edge behavior as the middle edge is dragged up on surface using stretch mode.

FIGS. 11a-11c are a sequence of displays that illustrates the hybrid behavior that include curved and straight edge being dragged to a surface with edge replacement behavior.

FIGS. 12a-12b are a sequence of displays that illustrate fillet adjustment behaviors.

FIGS. 14a-14c are a sequence of displays that illustrate a concave fillet that is being reduced to zero.

FIGS. 15a-15e are a sequence of displays that illustrate a convex fillet that is increased by dragging it towards its arc center and away from the surface.

FIGS. 16a-16c are a sequence of displays that illustrate curved edge adjustment in extrapolate mode.

FIGS. 17a-17c are a sequence of displays that illustrate a collapsing an edge.

FIGS. 18a-18c are a sequence of displays that illustrate the left edge of a surface being dragged such that the surface is completely collapsed.

FIGS. 19a-19c are a sequence of displays that illustrate the delete extra vertices features when there is a change in the surface that allows the system to remove extra vertices.

FIGS. 20a-20c are a sequence of displays that illustrate the snap tolerance when two vertices are within the snap tolerance.

FIGS. 21a-21c are a sequence of displays that illustrate the snap tolerance when a vertex is within the snap tolerance of an edge.

FIGS. 23a-23c are a sequence of displays that illustrate dragging an edge up to a point when in extrapolate mode.

FIG. 24a-24c are a sequence of displays that illustrate an edge being dragged to a different point using the default extrapolate mode.

FIGS. 26a-26c are a sequence of displays that illustrate dragging an edge to up to a curve when in extrude mode.

FIGS. 28a-28c are a sequence of displays that illustrate drag up to surface functionality in extrapolate mode.

FIGS. 29a-29c are a sequence of displays that illustrate a similar set of surfaces being extended up-to a surface using the extrude method FIGS. 30a-30c are a sequence of displays that illustrate the user splitting a surface by using edge drag.

FIGS. 31a-31d are a sequence of displays that illustrate dragging an edge to another edge that can cause the entire surface to be deleted.

FIGS. 32a-32c are a sequence of displays that illustrate an example use of the edge replace by dragging an edge.

FIGS. 33a-33c are a sequence of displays that illustrate another example of edge replace.

FIGS. 35a-35f are a sequence of displays that illustrate dragging an edge to a surface.

FIGS. 37a-37c are a sequence of displays that illustrate another example of the internal sheet body edge edit from FIG. 36a-36d.

FIGS. 38a-38c are a sequence of displays that illustrate an interaction with internal loops within a sheet body.

DETAILED DESCRIPTION

Embodiments are directed to repairing and improving computer-aided design (CAD) geometry for use in computer-aided engineering (CAE) modeling operations. The modeling operations include, but are not limited to meshing, load definition, boundary condition definition and design variable definition. A user may modify the objects of the geometric model by moving an edge of the surface by using a mouse, other pointing device, physical gestures or voice commands.

For example, a user may repair a simulation of the object by moving an edge of an object from its initial location to a new location using an input device, such as a pointing device. As the user moves an edge of an object from its initial location to its final location, the system aids the user by displaying a desirable set of possible intermediate or final locations. The system provides visual feedback to the user indicating the suggested locations and resulting shape. Once the user stops moving the edge and releases the edge, the system updates all of the geometry connected with the edge to ensure topological congruence and slope continuity for all adjoining edges.

Geometric repairing and improving refers to the modification of CAD geometry in such a way that the vertices and edges of an object, curve body or solid body that are internal to the curve bodies, sheet bodies, or face bodies are shared by one or more curves, edges or faces unless they represent an external boundary of the object. The system is configured to receive user input provided by a mouse or other pointing devices to modify the geometric and topological entities that collectively make up the two or three-dimensional geometric model. The system is configured to generate a graphical display of the geometric model, visual feedback and manipulation handles. Examples of the graphical display, visual feedback and manipulation handles are described in greater detail below with reference to FIGS. 2a-39c.

Figure 1:
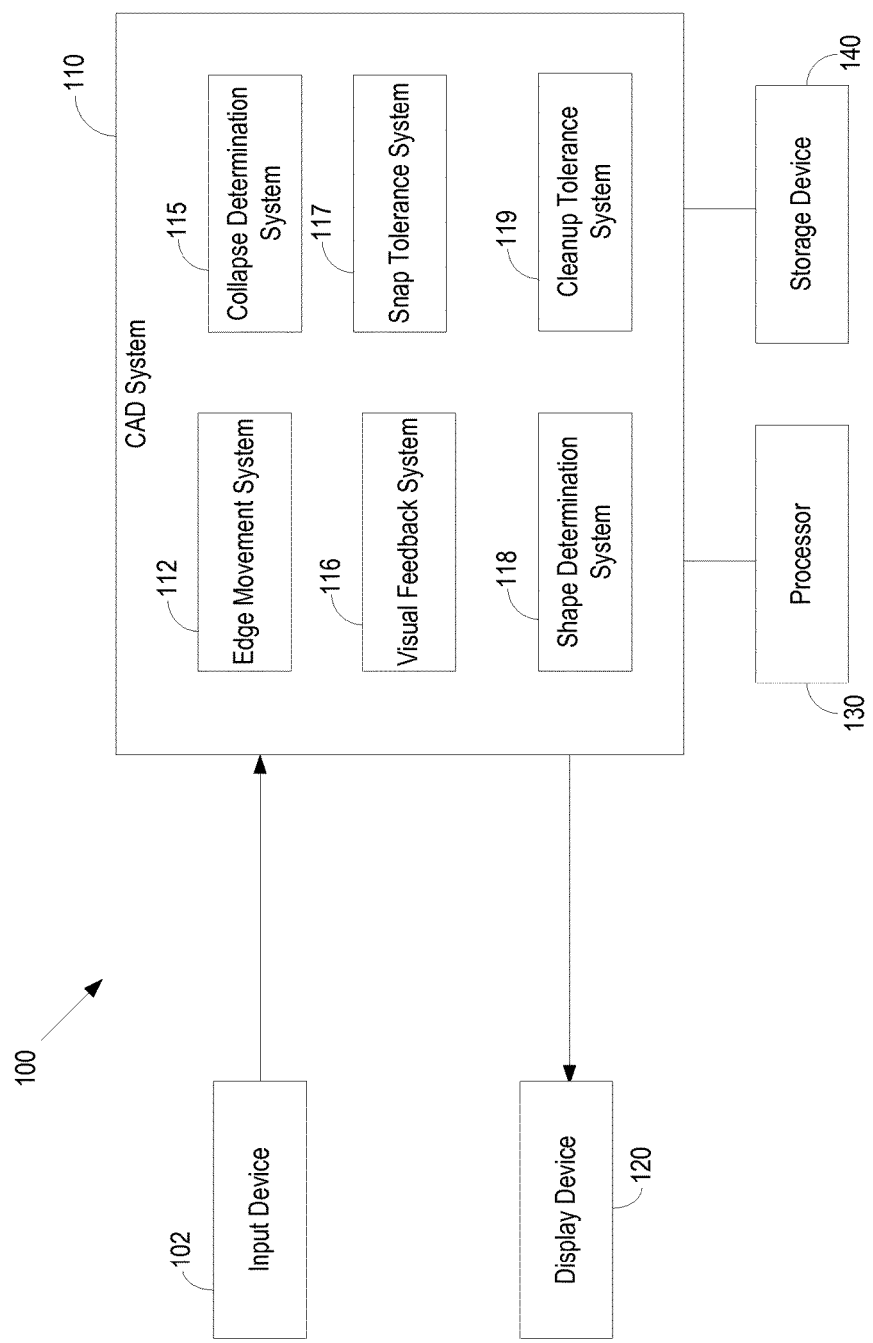
FIG. 1 is a schematic diagram of a data processing system according to an embodiment of the present invention.

Referring to FIG. 1, FIG. 1 is a schematic diagram of a data processing system 100 according to an embodiment of the present invention. System 100 includes a user input device 102, system 110, display device 120, processor 130 and storage device 140. The system 100 may include other devices such as network system, wireless communication, printer and other known devices.

The input device 102 as described herein may include a computer with a monitor, keyboard, keypad, mouse, joystick or other input devices performing a similar function. The input device 102 may include a keyboard including alpha-numeric and other keys, and may be coupled to the bus for communicating information and command selections to the processor 130. In one embodiment, the input device 102 has a touch screen interface or movement sensing interface that may be combined with, or separated from, display device 120. The input device 102 can include a cursor control device, such as a mouse, trackball, touch screen, motion sensor or cursor direction keys, for communicating direction information and command selections to the processor 130 and for controlling cursor movement on the display device 120. The examples illustrated in FIGS. 2a-39c describe the functions of a mouse having a left mouse button, center scroll mouse button and right mouse button. Other types of input devices may achieve functionality similar to the mouse or a combination of different input devices described herein.

The system 110 may be a computer system that is in communication with the input device 102, display device 120, processor 130 and storage device 140. In one implementation, the system 110 may be stored on a non-transitory storage medium that is at the same location as the user input device 102. In another implementation, the system 110 may be located in a different location than the input device 101. For example, the system 110 may communicate with the input device 102 through a network or wirelessly. Accordingly, the system 110 may be a cloud-based system that provides software as a service. In another embodiment, the system 110 may include the processor 130 and the storage device 140.

The processor 130 may be configured to receive instructions from the input device 102 and system 110. For example, the instructions may request the processor 130 to calculate the distance between two edges, the area of a resulting shape, snap tolerances and constraints for the vertices, edges and surfaces. The processor 130 is configured to receive data from and calculate results for each of the systems and logics within the system 110. The processor 130 may be, but is not limited to being, an Intel® designed processor, AMD® designed processor, Apple® designed processor, QUALCOMM® designed processor, or ARM® designed process.

The storage device 140 may include a memory such as a random access memory (RAM) or other dynamic storage devices. In another implementation, the storage device 140 may also include non-transitory storage media that is configured to store information regarding the geometric model that is being currently modified or was created in the past. The storage device 140 may send or receive data to or from the processor 130 and each of the other systems in the system 100. For example, the storage device 140 may be configured to communicate with the input device 102, system 110 and display device 120. In one embodiment, the storage device 140 may be a remote storage device that stores the system 110 data in a different location than the input device 102 or the system 110. In another embodiment, the storage device 140 may be located on the same computer system as the input device 102 and/or the system 110.

The system 110 is configured to provide a user with the functionality described below with respect to FIGS. 2-39c. The system 110 includes an edge movement system 112, collapse determination system 115, visual feedback system 116, snap tolerance system 117 and shape determination system 118. The system 110 may receive the geometric model information either from the user or from the storage device 140. In some implementations, a third party may provide the model information. Upon receiving the model information, the system 110 may display the geometric model on the display device 120. A user may choose to edit the objects within a geometric model. The objects may have vertices and edges that connect the vertices.

The edge movement system 112 is configured to receive user input requesting that a selected edge or edges be moved from a starting location to another location. The edge movement system 112 is configured to communicate the movement information for the edges to each of the other systems, circuits or modules of the system 100. In particular, the edge movement system 112 communicates the new edge locations to the visual feedback system 116 as the user moves the edge or edges. This information allows the visual feedback system 116 to generate a new edge or surface representing the resulting shape, if the user were to deselect the edges that are being moved. The visual feedback system 116 may perform various steps to determine the resulting shape and/or evaluate the movement of an edge to determine if the move is valid. If the edge movement is not valid, then the edge determination system 116 aborts the edge movement and the visual feedback system 116 may provide a clear error message. If the edge is moved to another edge then the surface may be split at the moved edge unless the edge was dragged onto another edge. The edge determination system 116 may evaluate all neighboring surfaces and edge to determine if congruency is achieved. The shape determination system 118 may update the effected surfaces and graphics to reflect the modifications.

The collapse determination system 115 may receive input from the edge determination system 112 and determine whether the resulting surface or edge should collapse because an edge was moved on top of another edge or an edge was moved on top of another surface.

After receiving data from edge movement system 112, the visual feedback system 116 generates dashed lines showing possible locations that an edge may be placed. The visual feedback system 116 may also generate an outline of the resulting shape of the objects after the user has moved a vertex or edge to a particular location. Moreover, the visual feedback system 116 continues to determine the new shape each time a user moves an edge and displays the dashed lines providing guidance to the user regarding the resulting shape on the display device. While the edge is being dragged, a thin, dotted or semi-transparent line will trace the approximate new edge shapes if the edge was released. The new shape is visible, but not so bold that it obscures the rest of the geometry. When the edge is released, the final geometry is calculated and projected onto the proper surface curvature. The original geometry will be unmodified until the edge is released. If the edges are curved or the "preserve tangents" mode is active, then the graphical feedback should reflect that by showing curved edges bending along with the edge drag.

The snap tolerance system 117 may establish the range of the snap tolerances for each vertex, edge, object or groups of objects in the model. The snap tolerance for any object may be a region of drawing space that surrounds each object. For example, the snap tolerance region of a edge may be a square region surrounding and encompassing the edge. The snap tolerance region for an edge may be a rectangle surrounding and encompassing the edge. The snap tolerance region for a surface may be a region surrounding the surface and shaped similar to the surface. In one implementation, the snap tolerance region is a predefined distance away from the shape of the object. In one implementation, the snap tolerance system 117 may detect that the user is moving a vertex, edge or object in the snap tolerance region of another vertex, edge or object. Upon detecting that a vertex, edge, surface or object is within the snap tolerance of another vertex, edge, surface or object, the snap tolerance system 117 may generate a constraint such that the object within the snap tolerance is automatically moved, without any further input from the user, to the other vertex, edge or object. For example, if a first edge enters the snap tolerance region of a second edge, then the snap tolerance system 117 moves the first edge to be on top of the same location as the second edge. In this example, the user may not want to snap the first edge on top of the second edge and the user may move the first edge away from the second edge to unsnap the two edges.

In one implementation, the system 100 may require that the user move the first edge out of the snap tolerance region of the second edge for the display device to show that the first edge is moving away from the second edge. In another embodiment, the user may enable or disable the snap tolerance system 117 for any one of vertices, edges or objects that may be moved. In another embodiment the user may use a keyboard key to temporarily activate or deactivate the snap tolerance properties of the vertex, edge or object that is being moved. In one embodiment, the snap tolerance region for any object in a model may not be visible, however a user can change the settings to display the snap tolerance region for one or more objects. In other embodiments, the user may choose to have the snap tolerance region of an object displayed as the user moves an object into the snap tolerance region of another object. The snap tolerance system 117 may be configured to detect the distance between objects. The snap tolerance system 117 may determine which portion of the objects will be snapped together based on the distance between the closest parts of the objects.

With respect to edge movement and snapping, the edges may be moved along a surface or to specific key points. It is common for users to try to maintain or create perpendicular and parallel edges. Accordingly, the snap tolerance system 117 is configured to favor perpendicular and parallel movements. These snap points and snap features will be guides to the user to aid in the cleaning up of the geometric model.

The snap tolerance system 117 may implement various edge behaviors discussed herein. For example, when dragging an edge, if the input device gets within snap tolerance region to any edge, then the edge may be highlighted and the edge will snap onto a surface or another edge. As long as the input device remains within the snap tolerance region of an edge, the edge will stay along the curve of the surface while following the movement of the input device. If the input device is moved away from the snap tolerance region of the edge, then the dragged edge snaps back to the input device position. Once an edge is snapped to another edge or surface, and the edge is dragged near another edge or surface, but the edge is still within the snap tolerance region of the current edge, the edge will stay snapped to the currently snapped edge.

The shape determination system 118 may receive data from the edge determination system 112, collapse determination system 115 and snap tolerance system 117 to determine the resulting shape of the object that was modified while the user is continuing to move an element (vertex or edge or surface) of the object. The shape determination system 118 may send data to the visual feedback system 118 to provide the user with visual feedback regarding the resulting shape in comparison to the original shape. For example, the resulting shape of the object may be shown using dashed lines overlaid on the original shape allowing the user to view the resulting shape. Moreover, the shape determination system 118 may adjust the curvatures of various objects to create a resulting shape that is in congruence with the moved object.

The cleanup tolerance system 119 is configured to remove small cracks, gaps, small overlaps, small edges and duplicate vertices. For example, when a user moves an edge to be on top of another edge as shown in FIGS. 2a-2c of U.S. patent application Ser. No. 13/353,225, entitled "Interactive Vertex Manipulation Systems and Methods for Geometric Repair" which is incorporated herein by reference in its entirety, one of the vertices is removed from the surface. In another embodiment, if an edge is moved from one edge to another edge and the surface is not removed, the edge that was moved to be on top of the other edge may be removed. Accordingly, the cleanup tolerance system 119 and the snap tolerance system 117 may detect small edges or small areas that are part of the surface. The snap tolerance system 117 and cleanup tolerance system 119 may remove the small edge or small area from the surface geometry. The edge attached to an edited surface may be replaced when the adjacent edge is moved on top of the edge. The cleanup tolerance value may be less than or equal to the snap tolerance value. A user may choose the cleanup tolerance value using a menu option. In one embodiment, the cleanup tolerance can be ½₀₀₀th the size of the largest model that may be created based on the geometric model. In another embodiment, the cleanup tolerance may be selected by the user to 1, ⅟₁₀₀th, ⅟₁₀₀₀th, ⅟₁₅₀₀th the size of the largest model. The cleanup tolerance system 119 may search the surfaces in a geometric model for edges or vertices that are smaller than the cleanup tolerance and remove them. In one embodiment, the cleanup tolerance system 119 may performed the cleanup tolerance check after every change in the surface geometry.

For example, after each edge drag operation is completed, all edges previously associated to the dragged edges and any new edges now associated to it are evaluated to determine if the size of any edges are less than the cleanup tolerance. If they are, then the edge is collapsed down to either an existing edge and other associated edges are adjusted. When there are edges that overlap each other or edited such that they fall within cleanup tolerance of another edge on the same surface, at least one edge is deleted by the cleanup tolerance system 119.

The system 100 may receive user input to interact with the model by dragging an edge and snapping the dragged edge with objects connected to the edge. Dragging an edge may be initiated by a user choosing to select and hold an edge with a user input device (i.e. holding the mouse button down (left or right)). The user may provide input to the input device to move the edge. In response to the user input, the system may move the edge and provide visual feedback to the user via a display device. The visual feedback may include, for example, one or more dashed lines showing the shape of the resulting object. In another embodiment, if multiple vertices are selected at once, then selecting any one of the edges and continuing to hold the left mouse button down will move all of the selected edges. The mouse pointer graphic may be changed to inform the user that the user can perform an edge drag. The mouse graphic may change when the user input device hovers over an edge while the system is in a surface (or face and curve) editing mode. In another embodiment, when the left mouse button is released, the selected edge is released at the location at which the left mouse button is released so long as the location is valid. If the edge released location is not considered valid, then the edge is not moved, and an appropriate error message is displayed on the display device.

Snapping the dragged edge with objects connected to the edge may be performed after the dragging operation has been completed. The system evaluates the newly formed shape to determine edge congruency, edge or surface collapse and surface split or partial collapse. To evaluate the congruency of two or more edges, the shape determination system may perform a two-step process. First, the two edges of each surface are determined to be either shared or within the current cleanup tolerance. The distance between the edges should not exceed the current cleanup tolerance at any place along their length. The procedure to evaluate distance between two edges can include evaluating the coordinate location at N number of parametric locations (depending on length and amount of curvature) along edge A, and then calculating the distance between these locations for edge B. If the distance between the two edges is within a cleanup tolerance defined by the user then the edges may be combined.

In some embodiments, the edge drag option is deactivated in a default setting and the system may activate the edge draft setting by receiving user input. Upon receiving the appropriate user input (e.g. function key, combination of keys, menu item selection, checkbox, etc.) the edge draft feature may be activated. In other embodiments, the edge drag option may be activated as a default setting and the user may deactivate the edge drag feature. In yet other embodiments, the edge drag features may be activated by the user selecting an edge and receiving user input to attempt to drag an edge within the work area. After the edge drag features is activated, an edge(s) may be selected and dragged by selecting and holding down the left mouse button or other suitable input devices. The mouse or the input device can then be moved and graphical feedback will be provided to the user. The graphical feedback follows the mouse in various directions (e.g. directions that are perpendicular and/or parallel to the original line, fixed normal direction, etc.). In other embodiments, multiple edges can be selected at once, clicking on any one edge from the multiple selected edges and holding the mouse button down and moving the mouse will move all of the edges that were selected. When the mouse button is released, the edge is released at that location where the mouse is pointing. Prior to placing the edge at the mouse location, the system 110 can perform a validation to determine that the placement of the edge meets the constrains within the system. The constraints within the system may be based at least partially on, manufacturing constraints, customer requirements, etc. When the edge is relocated to an invalid location, in some embodiments, the edge is moved back to the original location and a message is displayed to the user informing the user that the drag location was invalid and the reasons why the draft location is invalid. In other embodiments, when the edge is relocated to an invalid location, the edge is moved to the nearest valid location and message is displayed informing the user that the drag location was invalid and the reasons why the draft location is invalid.

While the edge is being dragged, if the mouse moves within the snap tolerance region of another element(s) (e.g. edge, point or surface) those element(s) will be highlighted or the color of the element(s) may change (pre-selection highlighting). Releasing the mouse or dropping the edge within the snap tolerance region will cause the modified edge to interact with that element as appropriate. In other embodiments, when the user wants to abort a drag the user may press a key (e.g. ESC or function), or release the edge at the snap tolerance with the original location. When the edge move outside the snap tolerance of the original location a first time and the edge is moved back into the snap tolerance of the original location, the edge may be snapped to the original location. In other embodiments, when the edge is initially moved within the snap tolerance of the original location the edge is not snapped to the original location, instead the edge is moved to the new location that may be located the snap tolerance of the original location.

Edge Drag Behavior

When an edge is being dragged or moved, it could and other edges that are connected to the dragged edge may behave differently based on the user choice. In some implementations, the edge could be moved rigidly and the edges that are adjacent to the dragged edge would stretch or follow the moved edge in some ways as described in greater detail below, or the other edges could behave to an extrusion, or concave or even a fillet radius adjustment may occur.

FIGS. 2a-2c are a sequence of displays that illustrate an edge drag using adjacent edge stretch mode. In some embodiments, the resulting new edge will conform to the surface. In some embodiments, when the edge is dragged outside of the surface, the edge will conform to an extrapolation of the parent surface. FIG. 2a shows a surface 200 with edges 201a, 203a, 205a, 207a, and 209 that are connected by vertices 210, 211, 213, 215, and 217 at angles 219a, 221a, 223a, 225a, and 227a respectively. The surface 200 in FIG. 2a may represent a physical object that is going to be manufactured. In the embodiment shown in FIG. 2a, a two dimensional surface 200 is shown as an example, the surface 200 could represent a three dimensional object that can be manufactured. In another embodiment, the dragged edge may be a surface, edge or vertex.

FIG. 2b shows a display generated by the system when a user selects an edge 205a and moves it in a direction 230. The edge may be moved in a various modes, for example, stretch, extrapolate, or extrude. Various methods may be used to change the edge movement mode. In an example embodiment, the user may hold a key and move the mouse to activate the various edge drag modes. Example of keys may include one or more of a shift, control, option, alt, command, function, etc. FIG. 2b shows an edge 203a being dragged in a direction 230. In the stretch mode the edges (203a and 207a) that are adjacent to edge 205a will become mobile to stay connected to the edge 205a that is being dragged. As the edge 205a is moved, a new edge 205b is shown to the user as feedback to show the new shape that will be created when the user drops the edge that is being dragged. Also shown to the user are new edges 203b and 207b that provide visual feedback to the user. As shown in FIG. 2b the angles 221a, 223a, 225a and 227a may be changed due to the movement of edge 205a.

FIG. 2c shows the resulting shape when the user moves edge 205a in the direction 230 the new shape 240 is created. The resulting shape has the same number of edges, but the angles 221a, 223a, 225a, and 227a have been changed. The length dimension of edge 201b, 203b, 207a is different than the length dimension of the edges prior to the movement of edge 205a.

Figure 3C:
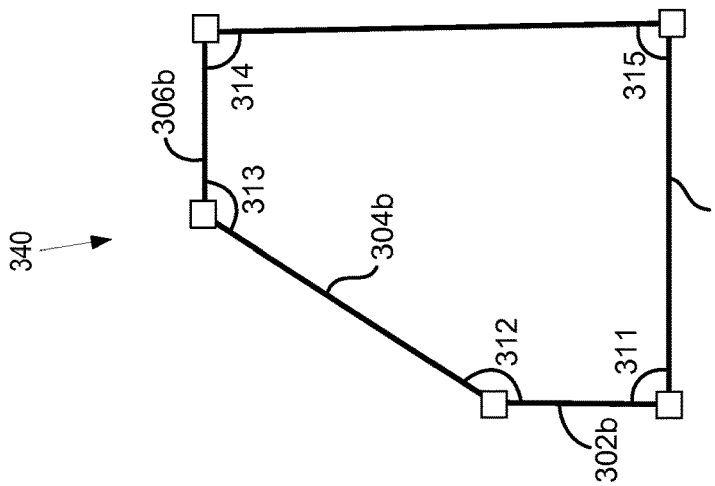
FIGS. 3a-3c are a sequence of displays that illustrate an example extrapolation feature using a selected edge.
Figure 3B:
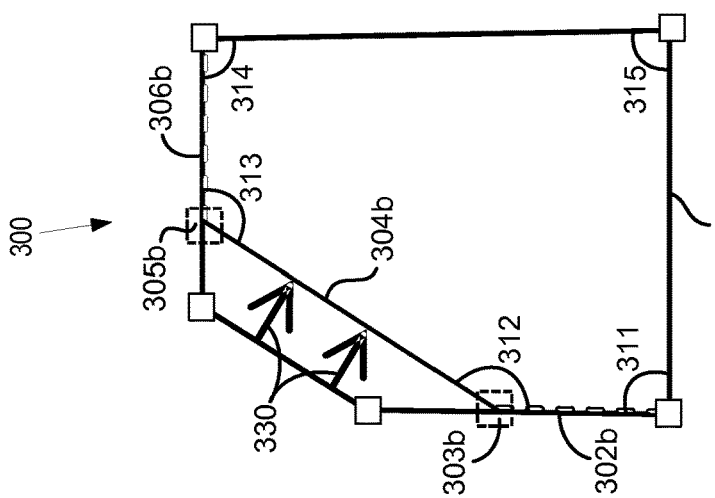
Figure 3A:
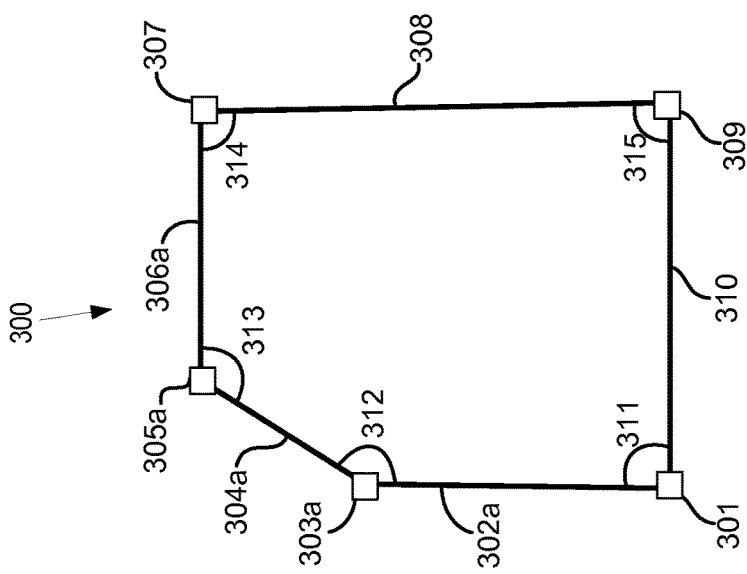

FIGS. 3a-3c are a sequence of displays that illustrate an example extrapolation feature using a selected edge. In some embodiments, when the edge is dragged outside of the surface, the edge may conform to an extrapolation of the parent surface. FIG. 3a shows a surface 300 with edges 302a, 304a, 306a, 308, and 310 are connected by vertices 301, 303a, 305a, 307, and 309 at angles 311, 312, 313, 314, and 315, respectively. The surface in FIG. 3a may represent a physical object that is going to be manufactured. FIG. 3a shows a user selecting the same starting point as FIGS. 2a-2c in a direction 330, but in this embodiment, the end vertices (301 and 307) stay on the adjacent edges (308 and 310) and the vertices are immobile. In FIG. 3c, the angles 31 and 314 remain the same after moving the edge 304a. Dragging an arc using this method will change the radius of a circular shape. Dragging a curved edge will produce and offset shape. Embodiments allow the user to constantly switch methods, especially when a user picks the methods from the GUI.

Figure 4B:
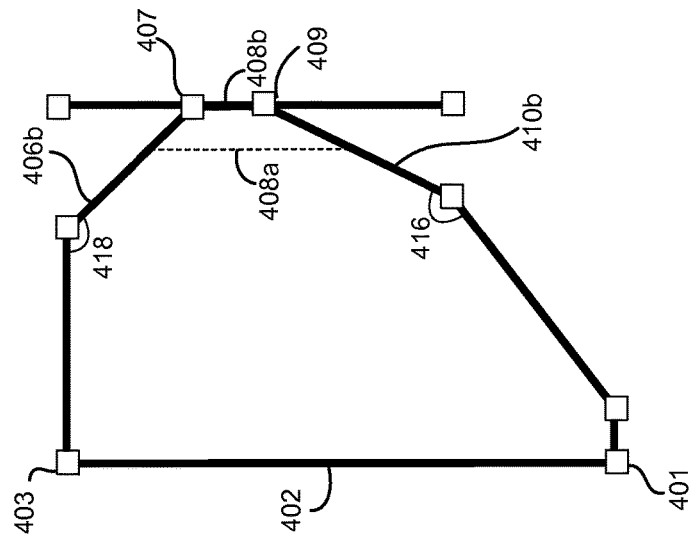
FIGS. 4a and 4b are a sequence of displays that illustrate another example with a shape being extrapolated outward to another adjacent surface viewed from an edge.
Figure 4A:
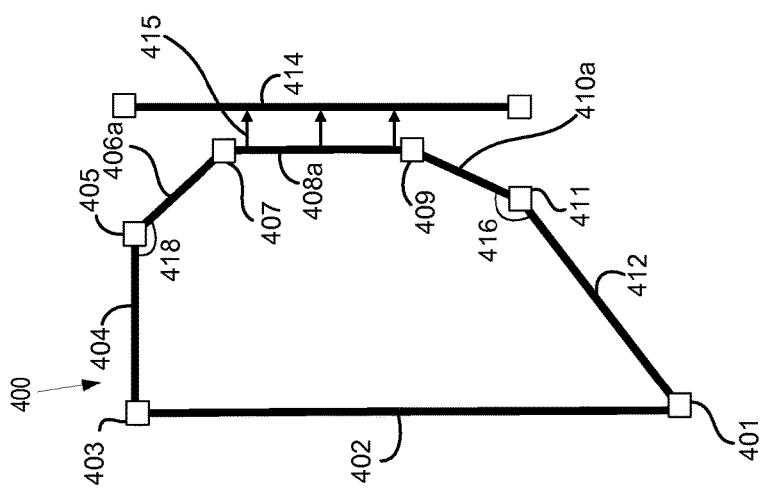

FIGS. 4a and 4b show another example surface 400 being extrapolated outward to another adjacent surface 414 viewed from an edge. An edge 408a of surface 400 may be selected and moved towards another surface 414 by a user. When the edge 408a is moved the other edges (406a and 410a) that are connected to the moved edge 408a may stretch while maintaining the original angle with other connected edges (404 and 412). The size of the moved edge 408a may be changed as shown in FIG. 4b, for example, in FIG. 4b edge 408b is larger in length than edge 408a that was created after edge 408a was moved. In FIG. 4b, the length of the edges that are adjacent to the moved edge 408a may be changed. For example, in FIG. 4b the lengths of edges 410b and 406b is greater than edges 406a and 410a. In some embodiments, the extrapolate mode may create new edges or vertices to keep the shape of the original surface or object.

FIGS. 5a and 5b are a sequence of displays that illustrate a surface with curved edges that are more challenging to extrapolate but may be stretched outward similar to the straight edges that were extrapolated in FIGS. 4a and 4b. In FIG. 5a, there may not be any edges that move outward towards the surface 530 that is represented as a line (surface 530 is shown from an edge view). The user should not be in a situation where the user cannot extend surface 500. It is obvious that that user is trying to drag the surface edge 508a in a direction 520, but a true extrapolation may not be possible due to the different curvatures of the other edges. The stretch mode may be used to rigidly offset the edge, and adjust the adjacent edges in the same manner as performing an edge replacement. The selected edge 508a is effectively projected on to the surface 530, then the adjacent edges 506a and 510a are stretched to meet the surface 530 as shown in FIG. 5b with respect to edges 506b and 510b. The projected edge is not a projection because the projection should be within the curvature of the green surfaces. The solution is approximately using the intersection curve between the two surfaces (if expanded infinitely), then projecting the edge in the normal direction along the curvature of the edge.

FIGS. 6a-6c illustrate the extrapolate method to edit the surface from FIG. 5a to reduce the size of the surface. Edge 601a may be moved in a direction 610 in order to reduce the size of the surface 600. As the edge 601a moves along the surface 600 the size of the edge enlarges to traverse the adjacent edges of the surface 600. In this embodiment, when one of the vertices of the edge 601a contacts another edge, the edge that was between the two vertices that are in contact with each other is removed from the surface 600. For example in FIG. 6c, edge 602 is deleted or removed. As a result of the movement of edge 601a an adjacent edge 604 is shortened.

FIGS. 7a and 7b illustrate an extrusion feature where edge 705 is moved rigidly as shown in FIG. 7a. As shown in FIG. 7a, the adjacent vertices 703 and 706 stay at their original location and new straight edges 752 and 751 are created to connect to the offset edge 712 to the original shape 750. The resulting edges 752 and 751 will all remain within the curvature of the original surface 700 or where the surface 750 ends up after the edge 705 is dragged to being edge 712.

FIGS. 8*a*-8*i* show variations on adjacent edge behavior for translate, extrapolate and extrude modes. The user may wish to extend the lower edges of surface 800 to a surface 810, but the user may not want the top edges to be changed. Since the left end of surface 800 is a sharp point at a vertex 802, the behavior can be different depending on whether new edges are added. A keyboard modifier in addition to other GUI inputs may allow the user to flip to the desired behavior for the appropriate situation. These three solutions (translate, extrapolate, and extrude) will each be used to solve problems by closing the gap between the two surfaces. In this example, two edges are pulled at one time.

Figure 8B:
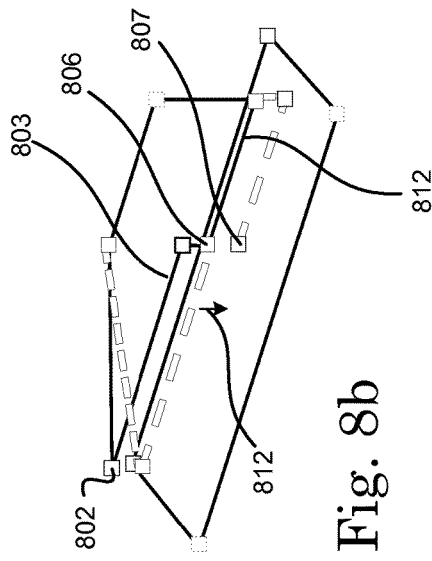
Figure 8A:
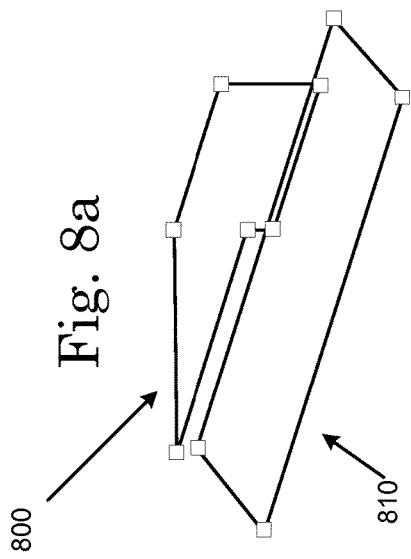
Figure 8C:
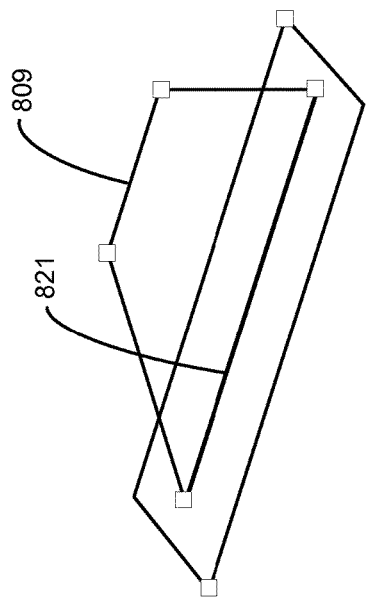

FIGS. 8*a*-8*c* illustrate a translation behavior where a surface 800 is configured to intersect with a surface 810 when the user moves the bottom edge of surface 800. As shown in FIG. 8*b* edge 803 of surface 800 may be moved in direction 812. Edge 812 may also be moved in the direction 812. Once edges 812 and 803 are moved past surface 810 the intersection between two surfaces is a single line 821. As shown in FIG. 8*c*, vertices 806 and 807 are removed from the surfaces 800 and 809.

FIGS. 8*d*-8*f* illustrate an extrapolate behavior where a surface 800 is configured to intersect with a surface 810 when the user moves the bottom edge 840 or vertex 830 of surface 800. As shown in FIG. 8*e*, the user is provided guidance lines that inform the user regarding the resulting shape. In FIG. 8*e*, surface 800 is extrapolated to extend the bottom edge and the edge that is connected to the bottom edge. Vertex 830 is shared between the edges that are being extrapolated. In FIG. 8*f*, bottom edge of the surface 800 is expanded including the edges that connect at a vertex 830.

FIGS. 8*g*-8*i* illustrate a extrusion behavior where the bottom edges of surface 800 match up to extrude past surface 810. In FIG. 8*g* the user may select edges 874 and 886 and move them downward. Once the surface 800 is extruded beyond surface 810 the shape of surface 800 is extended towards the adjacent surface 810. FIG. 8*h* shows the edges 896 and 894 being extruded outward. FIG. 8*i* also shows the resulting extruded shape. In FIG. 8*h*, the vertices (887, 888, and 889) that were located at the center of surface 810 have been removed because new edge 884 is a straight line between vertices 882*a* and 882*b*.

Figure 9B:
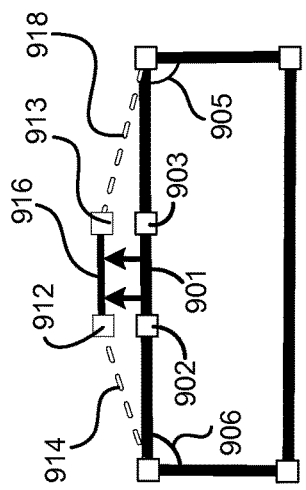
FIGS. 9a-9c are a sequence of displays illustrate an edge being moved using the edge drag features using the stretch mode such that the adjacent edges remain straight when they were straight prior to the move.
Figure 9A:
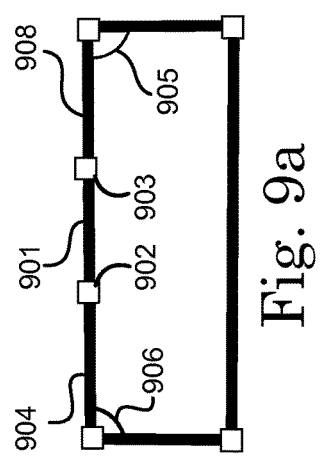
Figure 9C:
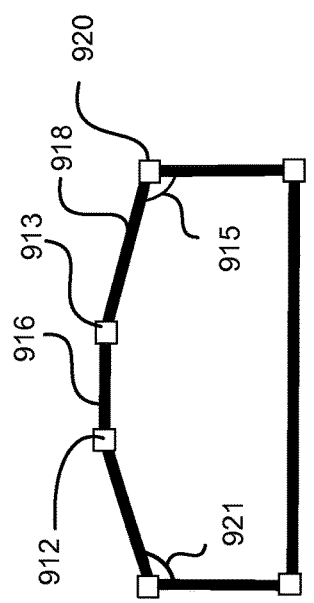

FIGS. 9*a*-9*c* illustrate an edge 901 being moved using the edge drag features, there are several different ways that the attached edges can be affected. The behavior illustrated in FIGS. 9*a*-9*c* shows a straight edge behavior where the top middle edge 901 in FIGS. 9*a* and 9*b* is being dragged up and released. Edges 904 and 908 both started out straight, and after the drag, they remained straight in FIG. 9*c*. If this surface was curved out of the page, they would appear straight, neglecting the surface curvature. The curvature of the surface is taken into account when determining an edge is straight or curved surface. In some embodiments, the surface curvature may be neglected when determining whether an edge is straight. In other embodiments very slightly curved edges may be treated as straight. In various embodiments, the behavior of the edges may be called "force straight" mode the adjacent edges may be forced to be straight and this mode will be triggered by a toggle or a shift key while dragging. FIG. 9*b* illustrates the system 100 providing visual feedback to the user as the edge 901 is being dragged. In FIG. 9*b*, the visual feedback is displayed as edges 914, 916, and 918. New vertices 912 and 913 are also displayed. In FIG. 9*c*, the angles 915 and 912 are created and the edges 914 and 918 remain as a straight line that connect with edge 916 using vertices 912 and 913.

FIGS. 10*a*-10*c* illustrate the curved adjacent edge behavior as the middle edge 1001 is dragged up on surface 1000. In the embodiments shown in FIGS. 10*a*-10*c*, the adjacent edges are curved, so the curved edge behavior was initiated. In various embodiments, the system 100 generates different changes in the edges based at least partially on the shape of the edge that is selected and/or the shape of the edges that are attached to the selected edge. In FIG. 10*b*, the starting and ending tangents and the angles of the adjacent curves for edges 1002 and 1007 are maintained. For small edits, this feature minimizes the curvature distortion. FIG. 10*b* provides visual feedback to the user as edge 1001 is moved to be come edge 1008. The edge 1001 is moved in a direction 1009 as indicated by arrows. In various embodiments, the visual feedback system may not display the direction of movement. In other embodiments, the system may display the direction of the movement and the angle of the movement away from the center of the edge that is moving. The angle of movement may be displayed adjacent to the direction arrow. The edges 1002 and 1007 that are adjacent to the edge 1001 that is being dragged maintain the vertex connections as the shape of the adjacent edges is changed to maintain the vertex connections. In the embodiments shown in FIG. 10*c* new edges 1008, 1010 and 1011 have been created. The curvature of the adjacent edges 1010 and 1011 may be determined using various algorithms. In one embodiment the center of the edge may be curved using a Bezier curve. In another embodiment, the edge may be bent at the center to have a sharp bend.

FIGS. 11*a*-11*c* illustrate a hybrid mode that includes both curved and straight edge movement. There are many shapes where one side of the edge will have a curved edge like a fillet and the other side is straight. In this example, the edge 1101 is dragged to a surface 1110 with a straight edge 1112 and released over another edge. This gesture causes the tool to act as an edge replacement mode. Vertices 1104*a* and 1105*a* are moved to a new location and become vertices 1104*d* and 1105*d*. When the vertices are within the tolerance distance of other vertices, the system combines the vertices by adjusting the angles or the distance of one or more edges of the surface. The shape of the top fillet curve edge 1102*a* is changed, but the system maintains its tangents and the edge 1102*a* remains curved. The bottom edge starts out straight and ends up straight when the edit is done. In one embodiment, the default mode will automatically keep significantly curve edges curved and close to straight edges straight. The system is configured to allow the user to change the curved edges. FIG. 11*b* illustrates the visual feedback that may be generated by the system. In particular, new edge 1102*b* and 1106 are displayed as dashed lines. After the edge is dragged, the distance between the vertices 1102*a* and 1104*a* is determined and checked against the tolerance distance. In the case where the distance between the vertices 1102*a* and 1104*a* is less than the tolerance distance, moving the edges that connect the vertices merges the vertices and a vertex may replace one or more vertices.

Scalar distance or radius input may be provided by the user. The inputting a scalar value in addition to a drag gesture can specify edge drag translation distance. During any edge drag the user can begin typing in floating point real number (positive or negative), and the user input will be used as the distance instead of the current relative cursor position or snapped-to destination geometry. While dragging with the left mouse button (LMB) held, the user may begin typing in numbers using the keyboard. Once the user input is received and the user releases the LMB, the operation will continue. In some embodiments, once the user completes his input, the user can enter a keystroke such as "Enter" to accept the changes on the screen. The distance, or radius if the curve was an arc, will be used as if the user dragged the cursor that same relative distance. The box will be visible near the cursor at all times when dragging edges and it should show the current relative drag distance or radius. If triggering an edge replace (snapped to another edge and not using and up to behavior, the relative distance may not be relevant, so it will be blank at that time.

FIGS. 12a and 12b illustrate fillet adjustment behaviors. Fillets will be treated special so users do not have to enter other tools to edit or remove fillets. Editing fillets can easily be added to edge drag gestures. If a surface edge (or curve edge) is a true fillet, arc or can easily be mapped to one, then a drag gesture will allow the user to edit the radius. These following examples all show the extrapolate mode. If a single fillet or round hole is clicked on, the user will be able to change the radius by dragging inward or outward. The floating numeric input box will show the current radius. The user can input the desired radius and hit Enter. If the user enters 0.0, than the radius will be removed and the shape of the edge will be changed to a corner with a single vertex. FIGS. 12a and 12b show an object with fillet shaped edge 1201 being increased by dragging a fillet edge 1201 in a direction 1202. A convex fillet is made larger by dragging the edge 1201 into the surface towards it arc center. FIG. 12a also provides the user with visual feedback for the drag behavior and new edge 1203 is shown in dashed line. FIG. 12b illustrates a fillet with a larger radius than the fillet in FIG. 12a.

Figure 13B:
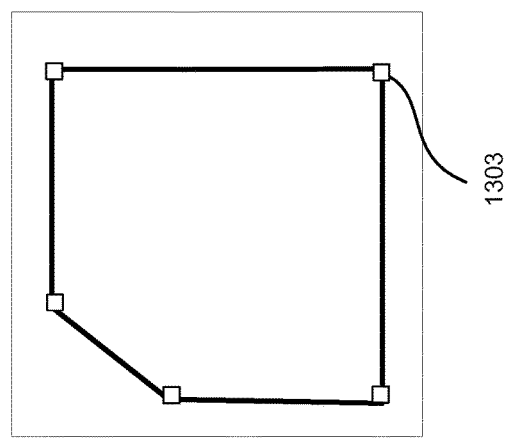
FIGS. 13a-13b are a sequence of displays that illustrate the surface from FIG. 12a-12b with the fillet being removed by dragging the fillet edge such that the radius of the fillet ends up being zero.
Figure 13A:
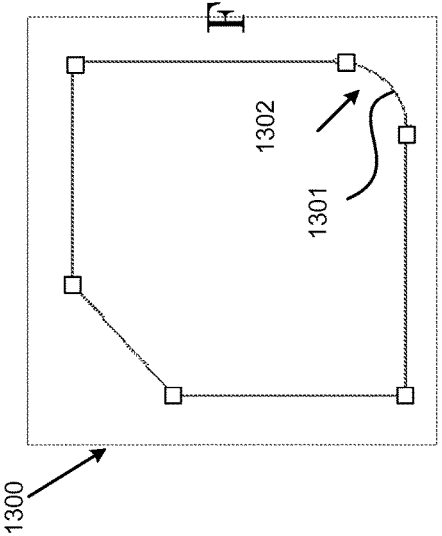

FIG. 13a shows the surface from FIG. 12a with the fillet being removed by dragging the fillet edge such that the radius of the fillet ends up being zero. In FIG. 13a the fillet shaped edge 1301 is dragged in a direction 1302. In an example embodiment with a convex fillet, dragging in a direction away from the surface reduces the radius of the fillet. In the embodiment shown in FIG. 13b the user went as far as away from the shape as possible, which created a sharp angle with a new vertex 1303.

FIGS. 14a-14c illustrate a concave fillet that is being reduced to zero by dragging into the surface and away from the arc center. FIG. 14a illustrates surface 1400 with a concave fillet 1403. FIG. 14b illustrates the user moving the concave fillet 1403 in a direction 1405 which happens to be into the surface 1400. In various embodiments, moving a concave fillet into the surface can reduce the radius of the fillet. In other embodiments, if the user continues to move the fillet 1403 into the surface, the fillet radius is reduced to zero and the fillet is changed to an angle with two edges as shown in FIG. 14c. A new edge 1407 is created because it connects two straight edges.

FIGS. 15a-15e illustrate a convex fillet that is increased by dragging it towards its arc center and away from the surface. In various embodiments, fillets will have a limit where they cannot be made larger than the size of the surface. This should be done when the tangent to the adjacent edges can no longer be created. Any attempt to make the fillet larger should result in no increase, and a warning that the maximum fillet that will fit has exceeded may be displayed. In this example, the final fillet should be the max. FIG. 15a illustrates a surface 1500 with a fillet 1502. FIG. 15b illustrates the fillet edge 1520 being created by dragging the fillet 1502 from FIG. 15a away from the shape. FIG. 15c illustrates the surface 1502 with new vertices 1533 and 1534 that are created to accommodate the new curvature created by the fillet drag from FIG. 15b. FIG. 15d shows the resulting small edges being removed as they may cause problems in meshing. When the edges that connect vertices 1533 and 1534 are smaller than a predetermined tolerance amount, one of the vertices may be removed and the small edge is merged into another edge that is parallel to the small edge. In the example shown in FIG. 15e vertex 1534 is removed and the small edge that connected vertices 1533 and 1534 is merged into the edge that is shown below vertex 1534.

FIGS. 16a-16c illustrate curved edge adjustment in extrapolate mode. FIG. 16a illustrates a surface 1600 with various edges, and holes. Curved edge 1602 and hole 1604 are shown on surface 1600. FIG. 16b illustrates a user moving the curved edge 1602 being dragged in a direction 1601. As the curved edge is dragged, FIG. 16b provides visual feedback to the user by showing the new edge 1605 that may be created. Vertices 1610a, 1610b, 1610c and 1610d are also highlighted and may be shown as disappearing as the user moves the curved edge 1602. Curved edge 1602 that is not an arcs will move in a normal direction offset as shown by the arrows in FIG. 16b. FIG. 16c shows the resulting shape with new vertices 1606, 1607 and 1608 and a new edge 1605.

FIGS. 17a-17c illustrate a collapsing a surface or edge. Any edge will be collapsed if after the edge is released and an edge becomes within cleanup tolerance of zero. FIGS. 17a-17c show an edge being dragged such that it collapses an edge. FIG. 17a illustrates a surface 1700 that includes an edge 1703, 1703 and a vertex 1702. In FIG. 17b the edge 1703 is dragged in a direction 1706 and the system generates visual feedback for the user to illustrate the edge 1704 that may be generated. FIG. 17c illustrates a smaller shape with an edge 1704 and vertex 1702.

FIGS. 18a-18c show the left edge of a surface 1800 being dragged all the way to the right so that the surface is completely collapsed. In the embodiment shown in FIG. 18a, the surface will be deleted along with all its edges that are not associated with other geometry. In some embodiments, all associated vertices, unless they are referenced by other geometry, will also be deleted. In FIG. 18a, vertices 1803, 1804, 1805 and 1806 and edges that connect the vertices form a surface 1800. FIG. 18b illustrates the user moving edge 1802 toward an opposing edge. In various embodiments, the entire surface 1800 and all elements or attributes of the surface is deleted, when the user drops the edge 1802 at or near the opposing edge. As shown in FIG. 18c, the dotted line 1810 is shown and the user may hit delete or backspace key to remove the remainder of the surface 1800.

FIGS. 19a-19c illustrate the delete extra vertices features when there is a change in the surface that allows the system to remove extra vertices. After each edit all vertices involved in the edit or created during the edit are to be evaluated to determine whether due to the edit, the vertices are topologically significant. In CAE finite element meshing, there will be a node placed on every vertex. Geometry is a direct reflection of the final mesh topology, so any extra vertex that is not required to describe the geometry can cause a significant problem. The example embodiment shown in FIGS. 19a-19c is an example of a vertex 1930 that can be deleted. FIG. 19a illustrates a surface 1900 and 1910. Edge 1935 and In FIG. 19a, vertex 1930 is geometric vertex that is required because there is a change in the direction of the edges that are connected to the vertex 1930. After the edit in FIG. 19b, the continuous straight line may not need vertex 1930 and the vertex 1930 may be removed in FIG. 19c. In FIG. 19b the system provides the user visual feedback by generating edges 1940 and 1945*a* when the user moves the edge 1935 in a direction 1945*b*. FIG. 19*c* shows the resulting surface 1900 and new edge 1955 that lacks vertex 1930.

FIGS. 20*a*-20*c* illustrate the snap tolerance when two vertices are within the snap tolerance. After an edit or edge drag is performed, such as dragging an edge onto a surface, up-to a curve, up-to a point and so on, the end result could have a very short edge, or two vertices that are very close to each other. These are invisible to users, but can cause significant problems with meshing later. When users find these, they can easily be fixed, but the system must assume that any edge less than a cleanup tolerance is undesirable, so they will be removed automatically by the cleanup behavior. The example in FIGS. 20*a*-20*c* shows the result after an edge drag up-to an edge or up-to a vertex. The result is that the surfaces share an edge, but this causes a very short edge that is less than cleanup tolerance (The gap is shown larger than normal for visualization purposes). In various embodiments, the newly changed vertex will be moved up to the nearby existing vertex or down to the nearby existing vertex. In FIGS. 20*a* and 20*b* surface 2000 is moved toward surface 2002. In FIG. 19*b*, vertices 2008 of surface 2000 and vertex 2006 of surface 2002 are determined to be less than the tolerance distance away from each other. Accordingly, the system creates FIG. 20*c* where vertices 2006 and 2008 are merged by moving edge 2011 and changing the angle 2013. In FIG. 20*c* vertex 2003 replaces both vertices 2006 and 2008.

FIGS. 21*a*-21*c* illustrate an object that is configured to snap edges together when the edges are moved to be close in proximity to each other. In FIG. 21*a* an edge was dragged down onto a surface, splitting the surface and making the two surfaces congruent. The split almost reaches the edge of the surface. Unless zoomed in as shown in FIG. 21*b*, this tiny gap may be invisible. The system 100 may highlight the gap for the user by using a different color or flashing a different color. The system 100 may be configured to automatically snap together the two edges to form an orthogonal connection. For this example, the gap causes two issues. The split that was intended by the user fails to break the surface 2100 in half as the user expected. The resulting structure produces problem elements when meshing. Since this gap is less then cleanup tolerance, it will be automatically removed as shown in the zoomed in version in FIG. 21*c*. FIG. 21*c* illustrates the automatically snapped shape 2103.

Figure 22C:
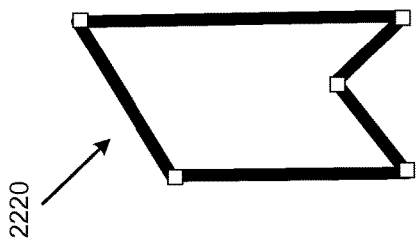
FIGS. 22a-22c are a sequence of displays that illustrate deleting sliver surfaces.
Figure 22B:
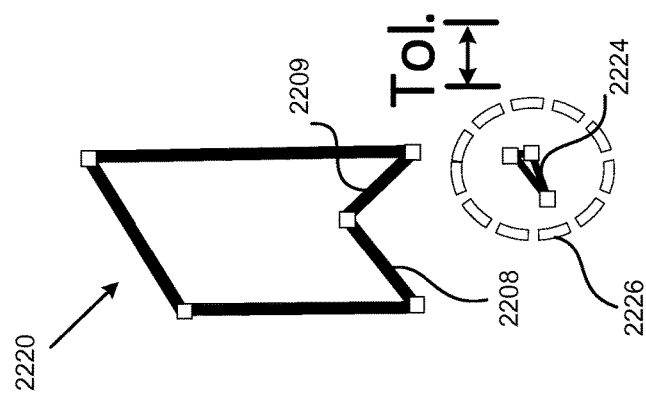
Figure 22A:
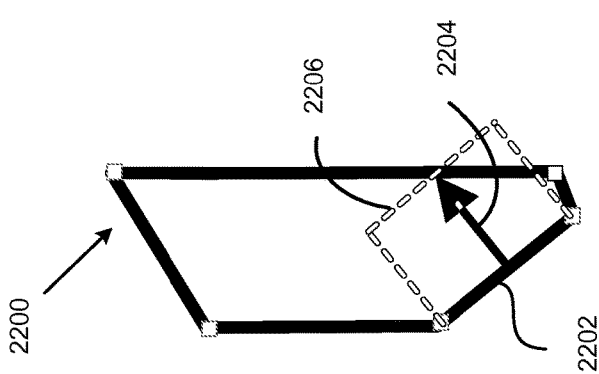

FIGS. 22*a*-22*c* illustrate the system 100 deleting sliver surfaces that are remnants of an extra shape left behind after a shape edit. Another type of small artifact that is automatically cleaned up is sliver surfaces. In FIG. 22*a* an edge 2202 is moved in a direction 2204 and the system 100 displays visual feedback shape 2206. Shape 2206 illustrates the shape that may be created after the edge is moved. FIG. 22*b* illustrates surface 2220 that may or may not be displayed to a user. New edges 2208 and 2009 are created to connect the surface 2220. FIGS. 22*a*-22*c* show that after an extrude drag over the top of the surface 2200 a small surface 2224 is cut away. The small surface 2224 is thinner then the cleanup tolerance 2226 and has edges that are shorter than this tolerance as well. This surface 2226 will be completely deleted. The system 100 may not display the surface 2226; the system 100 removes the sliver surface 2226 before the user sees the sliver. Even if there was no short edge, but the surface was thinner than the tolerance, it should be removed or never created. FIG. 22*c* illustrates the resulting shape after removing the sliver surface 2226.

FIGS. 23*a*-23*c* illustrate dragging an edge up to a point. While dragging edges, a user can move the cursor a desired distance using the cursor, or input the distance, but sometimes there is a point or location that represents the distance. Edge drag also has an up-to option for points, vertices, nodes or any valid location pick. The user will be able to initiate a drag, move the cursor over a packable location. This relative displacement (or the normal component of it), will be used to move the edge. FIGS. 23*a*-23*c* show an extrude mode example. In FIG. 23*b* the user may move an edge 2304 in a direction 2314. The system 100 may display the resulting shape in dashed lines. The resulting shape shown in FIG. 23*b* illustrates edges 2316 and 2318 that may be generated. Edge 2308 is connected to surface 2300 at vertex 2324 and the vertex 2324 remains unaffected by the movement. Edge 2316 is created because of the movement of edge 2308. Edge 2319 is created based on the angle between the adjacent edge 2308. FIG. 23*c* illustrates the resulting shape with a new edge 2316 and a new edge 2319. Portions of edge 2308 are now located within the surface 2300.

FIG. 24*a*-24*c* show an edge 2404 being dragged away from the surface 2400 using the default extrapolate mode. The user selected the edge and held the LMB down, and dragged the cursor over to pre-select the vertex before releasing the LMB. The surface will not bend to touch this vertex in any way. It is use as a scalar distance measurement. FIG. 24*a* illustrates a surface 2400 that includes an edge 2404 and another edge 2408 that is connected to the contiguous surface by an edge. FIG. 24*b* illustrates a user moving an edge 2404 in a direction 2408 and the system generating visual guides for the user. In this embodiment, length of edge 2417*a* is increased and the edge 2417*a* retains its original angle. At the same time the length dimension of edge 2404 is reduced to create edge 2419. FIG. 24*c* illustrates the resulting shape. FIG. 24*c* shows vertex 2424 at its original location from FIG. 24*a*.

Figure 25C:
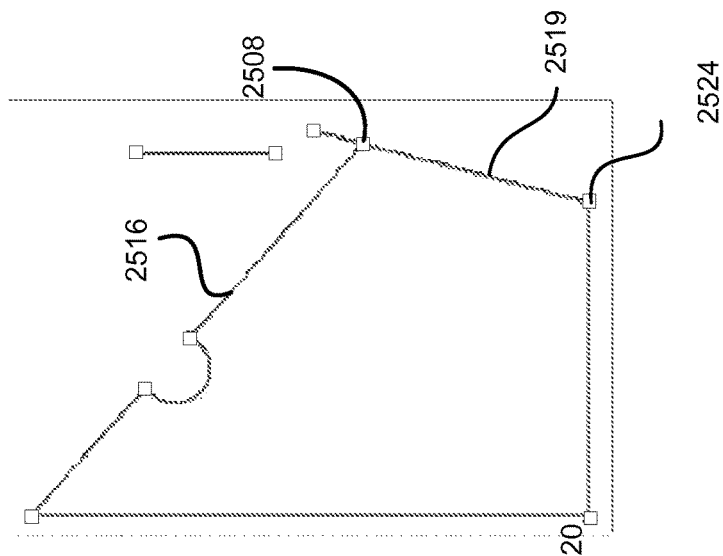
FIGS. 25a-25c are a sequence of displays that illustrate drag an edge up to curve when in extrapolate mode.
Figure 25B:
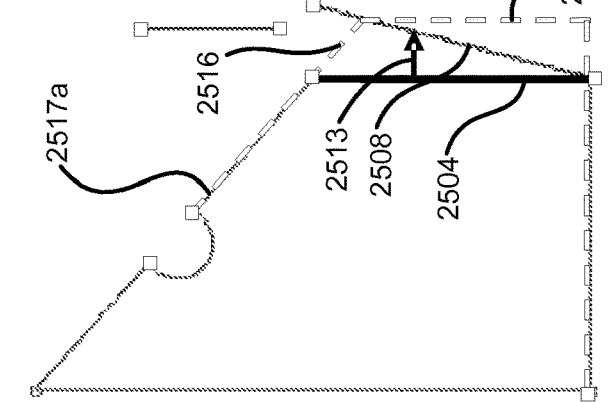
Figure 25A:
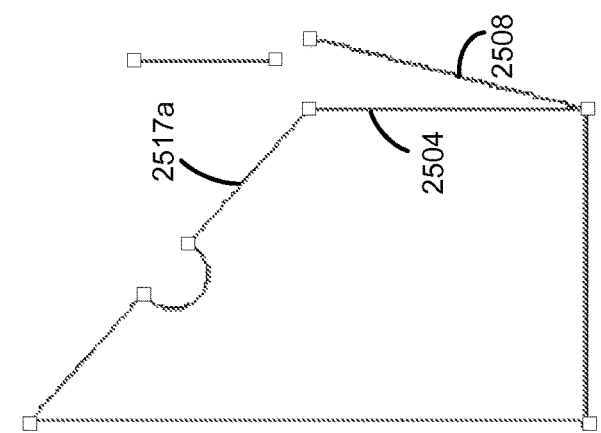

FIGS. 25*a*-25*c* illustrate drag up to curve behavior for surface 2500. If the user drags an edge 2504 over to another curve or edge, it will trigger a more common replace operation by default and not an up-to. A gesture, such as an Alt key, will trigger the less common up-to behavior. Up-to curve behavior acts similar to dragging onto another surface. Depending on whether the extrude mode or extrapolate mode is being used, it finds the part of the curve that represents a projection or closest intersection and rebuilds the surface to use that part of the curve as the new edge. In FIG. 25*a* surface 2500 includes various edges and vertices such as, edge 2504, (2517*a*), and edge 2508. FIG. 25*b* shows a user moving an edge 2504 in a direction 2513. FIG. 25*b* also shows edges 2516 and 2520 that may be generated as the user drags edge 2504. FIG. 25*c* illustrates the system merging edges 2504 and 2508 to create an edge 2519. In other embodiments, edge 2504 may conform to the shape of edge 2508 when the user drags an edge in the vicinity of the edge 2508. The angulation of edge 2504 is changed to conform to the angulation of edge 2508.

FIGS. 26*a*-26*c* show an example using extrapolate mode. Here, the edge is dragged outward, the user holds the ALT key down (or any other key), and drags within snap tolerance of the target edge 2608. At this point, the edge will be extended up to this curve. Unlike a replace, the up-to operation will not bend the surface to the curve. The exception to this behavior is the surface and up-to curve are within cleanup tolerance after the operation. Once within the cleanup tolerance, the near by edges 2608 and are moved to touch or are replaced with a single conforming edge 2619. In FIG. 26*b*, edge 2604 is moved in a direction 2613 towards edge 2608. While edge 2604 is moved a new edge 2616 is created to extrapolate surface 2600.

Examples of the steps that are taken to produce an up-to edit are shown in FIGS. 27a-27h. These are three general examples that are intended to cover various embodiments. The algorithms or behaviors discussed below handle various embodiments. The steps to performing the changes are discussed below when the user has already gestured the intent to extend up-to a curve. Extend the edge past the curve a significant amount (with extrapolate method, this may be a limited distance or not even reach the up-to curve). Next, extend the "up-to" curve using constant curvature. This does not change the actual curve, but a copy or representation of it. This is to ensure that the up-to curve is long enough. Project the extended curve onto the extended surface from the first step. If the projection does not produce a cut all the way through because of curvature restrictions, a closest approach split is made to the surface boundary. This was done in FIGS. 27a-27h.

Figure 27B:
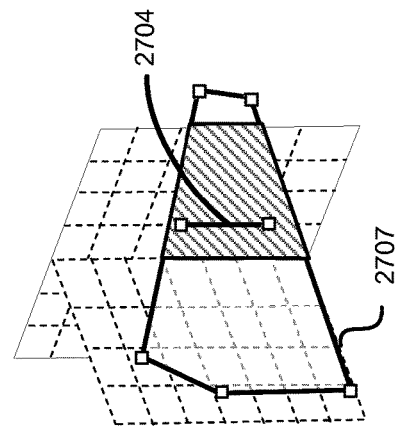
FIGS. 27a-27h are a sequence of displays that illustrate examples of the steps that are taken to produce an up-to curve edit when the curve does not lie on the surface being edited.
Figure 27D:
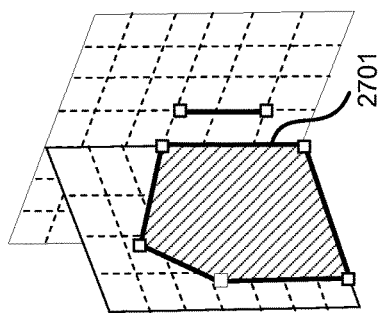
Figure 27A:
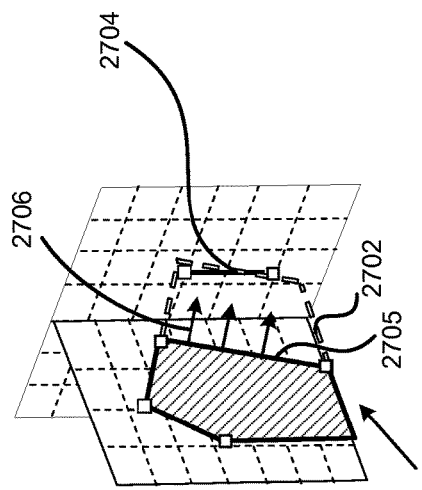
Figure 27C:
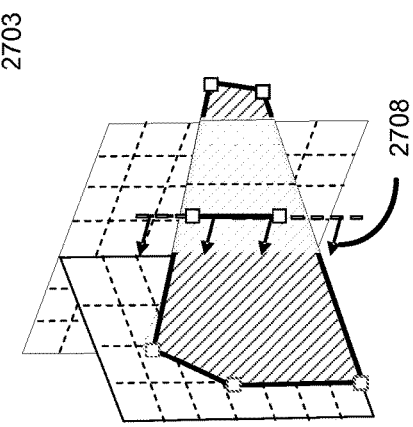

In FIG. 27a, surface 2700 lays in or is parallel to a first plane that is orthogonal to a second plane with an edge 2704 that lies in the second plane. Edge 2705 is shown being extended in a direction 2706. The system 100 generates visual feedback 2702 to allow the user to see the resulting shape after the movement of edge 2705. FIG. 27b shows a resulting surface 2700 (having edge 2707) that extends past the edge 2704. FIG. 27c illustrates the edge 2704 being dragged in a direction 2708. When the edge 2704 contacts the surface 2700 it may have the effect of creating a new edge 2703 at the point of contact. The edge is located on surface 2700, but will have the shape of edge 2704. FIG. 27d shows the changed shape of surface 2700 and the new edge 2701.

Figure 27F:
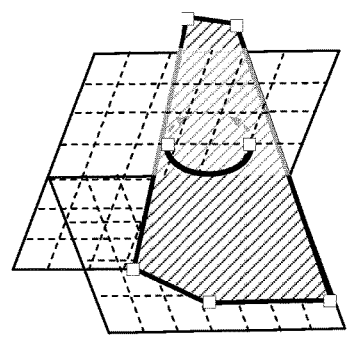
Figure 27H:
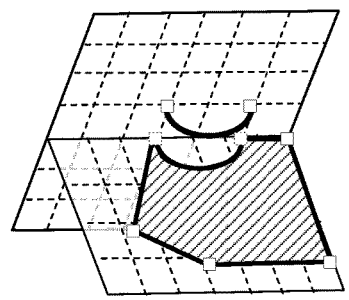
Figure 27E:
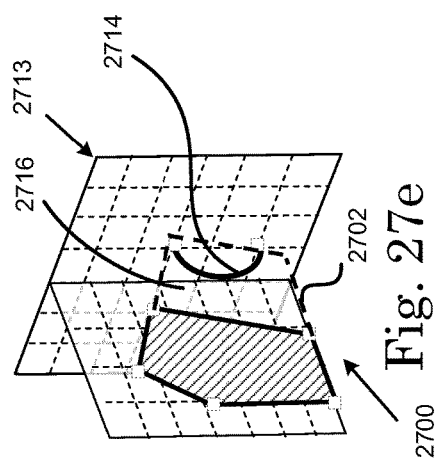
Figure 27G:
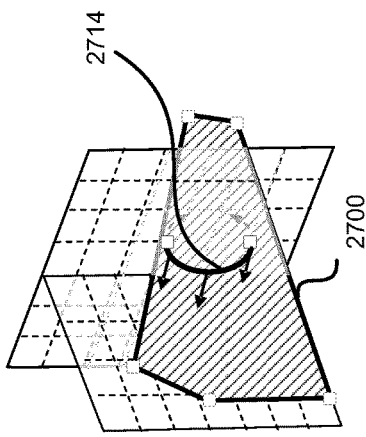
Figure 27J:
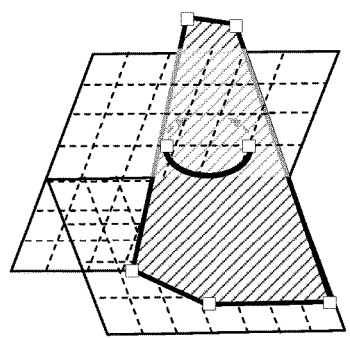
Figure 27L:
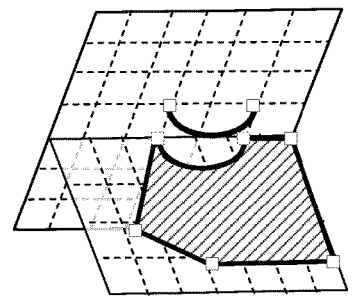
Figure 27I:
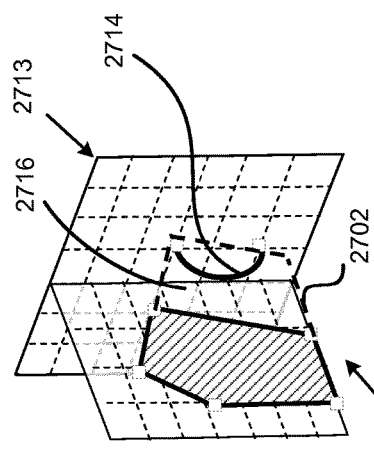
Figure 27K:
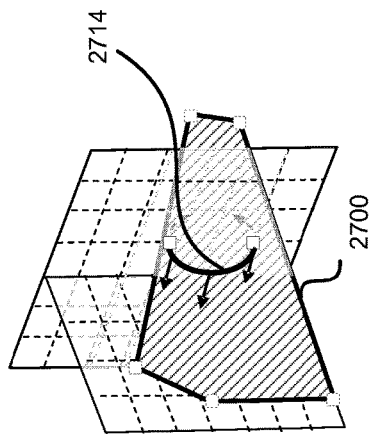

FIG. 27e-27h illustrate a user manipulating a surface 2700 and a curved edge 2714. In FIG. 27e the user moves an edge from the surface 2700 as shown in FIG. 27f. In FIG. 27f the user may continue to change the curvature of the curved edge 2714. Next in FIG. 27g, the user may move the edge 2714 against the surface 2700. In FIG. 27h, it is apparent that the edge creates an impression that has the same shape as the edge 2714.

FIGS. 28a-28c illustrate the drag up to surface functionality. Drag up to surface is used for mid-surface modeling very often. The algorithm should be similar to dragging up-to a curve algorithm discussed above. For most cases, it will appear as though the extrusion went past the surface, and then was trimmed on the surface. The one exception is for surfaces with tangent edges attached to the surfaces and when the system is configured to operate in extrapolate mode. FIGS. 28a-28c show three edges 2808, 2810 and 2811 being extended to a surface 2803 on the right using the extrapolate method. The top and bottom surfaces will not be able to extrapolate their adjacent edges and reach the surface, so they have to be stretched to reach the surface. As shown in FIG. 28a, edges 2808, 2810 and 2811 extend each edge to surface 2803. In FIG. 28a the user has determined to move edge 2810 from it's original location to be in contact with edge 2803. As shown in FIG. 28b, other shapes that are connected to the surface of edge 2810 are also moved in accordance with the movement of edge 2810. For example, edge 2808 and edge 2811 are each moved in accordance with the movement of edge 2810. FIG. 28b shows visual feedback shapes 2806 and 2812 that may be generated when the user releases edge 2810. FIG. 28c shows the resulting shape where the top end of edge 2810 is in contact with edge 2803. In this embodiment, each of the surfaces is expanded proportionally accordingly the original ratios for various edge sizes for the moved surfaces are retained.

FIGS. 29a-29c show a set of surfaces being extended up-to a surface using the extrude method. In FIG. 29a the user selects edge 2908 and moves it towards edge 2903. Other surfaces that are attached to the surface of edge 2908 are moved in congruence with the movement of edge 2908. For example, as shown in FIG. 29b, edges 2904 and 2906 are moved towards edge 2903. FIG. 29b shows the visual feedback edges 2910, 2912 and 2914 that illustrate the resulting shapes of each respective surface. As shown in FIG. 29b, the surfaces for each edge that is moved is extruded out to create new edges that expand the surface in the direction of the movement of edge 2908. FIG. 29c shows the new edges 2931, 2933, and 2935 that were created due to the extrusion. As a result of creating new edges new vertices that connect the new edges 2931, 2933 and 2935 to their respective surfaces may also be created.

FIGS. 30a-30c illustrate the user splitting a surface by moving one or more edges. In FIGS. 30a-30c, edge 3005 on the left was dragged all the way across the surfaces until it is right onto the small middle edge 3003 shared by the two surfaces. Since the cursor drags the edge 3005 in a direction 3004 over to the edge 3003, an edge replacement behavior is triggered. The adjacent edges 3002 and 3008 were straight, so they become straight edges 3012, 3018 connecting the new edge to the adjacent curves. If the surface were curved then these straight edges 3002 and 3008 would conform to the surface curvature. FIG. 30c illustrates the resulting shape to split the surface into two surfaces; all three surfaces remain congruent. In FIG. 30c, edge 3003 replaces edge 3005.

FIGS. 31a-31d illustrate dragging an edge to another edge (e.g. edge replace, extend edge to curve). In FIG. 31a, when an edge 3105 is being dragged and the cursor moves over an edge to select it, releasing the LMB while it is snapped to a second edge 3103 will force edge replace functionality to be activated. The surface edge 3015 is moved to create a new edge 3119. The new edge 3119 may not be on the curvature of the original surface, so the edited surface has to be adjusted (bent) to incorporate the new edge 3119, as shown in FIG. 31b. If multiple edges are picked and dragged at one time, and they are released on another edge, then all edges will be replaced by the single edge as long as all initial edge were continuous and the resulting topology is valid. The example shown in FIGS. 31c and 31d allow the user to delete a surface by dragging one edge on top of another edge.

FIGS. 31c-31d show a surface or a portions of a surface being deleted by dragging an edge 3125 onto one of its other edges 3123. The result happens to end up with no area with all overlapping edges, so the surface is gone, and all edges and vertices except for the ones common with the surface 3129 are deleted. The graphics reference edge lines (dotted) show the progress at the surface is being edited. The edge is rigidly being moved across the surface. There are graphic lines showing how the surface would be edited if it was released. The dashed area shows what will be changed, in this case, cut away. In the FIG. 31c, the cursor moves over within snap tolerance of its right edge 3123. This triggers a replace and the preview graphics update to reflect that. When released the surface 3110 and all of its unreferenced vertices and edges are deleted.

FIGS. 32a-32c show an example use of the edge replace by dragging an edge 3202 onto an adjacent surface with edge 3203. In FIG. 32a-32b there is a large gap between two surfaces. This gap may have been two large for stitching during import to detect. The user can drag either edge over to the other one to repair the gap. In this case, the curve edge 3202 is being dragged towards the straight edge 3203. As the mouse passes over the straight edge 3203, it highlights the straight edge 3203. When the LMB is released, the curved edge 3202 is replaced with the straight edge 3203. The surfaces are then congruent and the gap between the surfaces is repaired.

FIGS. 33a-33c show another edge drag from one straight edge 3310 to another edge 3302. In FIG. 33a, a surface 3301 and surface 3308 are shown adjacent to each other with a large gap surrounded by a curved edge 3302 and straight edges 3305. In FIG. 33b, straight edge 3310 is moved in a direction 3309 towards the curved edge 3302. The system generates a graphical display to inform the user regarding the resulting shape after the move. In this example the gap that needs to be closed has two edges 3310 and 3305. Only one edge 3310 needed to be moved in this case. The adjacent straight edge 3305 also became congruent because its edge overlapped the blue surfaces edge within tolerance. When the curved edges are highlighted the LMB may be released to generate a shape in FIG. 33c.

Figure 34:
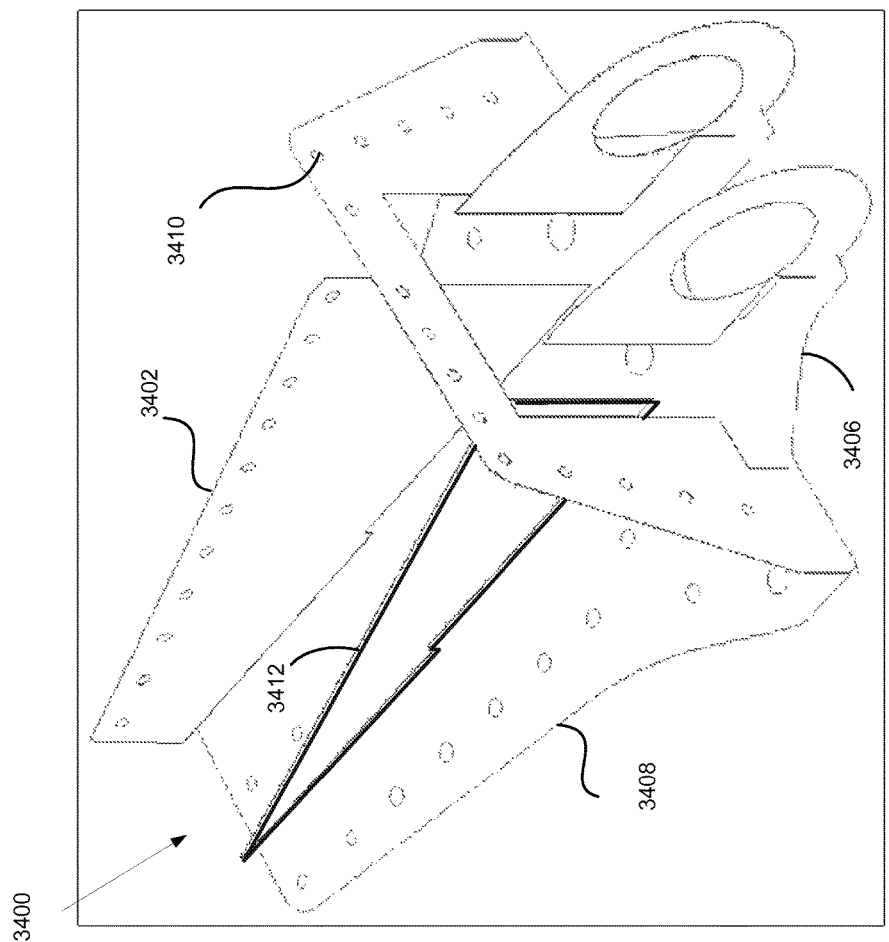
FIG. 34 illustrates an image that represents a typical mid-surface modeling scenario.

FIG. 34 illustrates dragging an edge 3412 to a surface to extend an edge to a surface 3408. FIG. 34 shows 6 different surfaces that should be extended to touch each other. In most cases, they need to be extended to another surface. To perform this task, the user would drag one or more edges onto a surface. This is done by dragging the edges, and when the mouse moves over a surface, the surface may be highlighted or the color of the surface may be changed, releasing the LMB will then perform an extend operation up-to the surface.

FIGS. 35a-35f illustrate dragging an edge to a surface. The highlighted surface 3410 in FIG. 34 is simplified and shown in FIGS. 35a-35f. The bottom two horizontal edges may be dragged up-to or on-to the bottom surface. This is shown in two detailed steps. First the lower edge 3510 is dragged down in FIG. 35b. The drag behavior extrapolate is being used for edge 3510. As the drag begins, the preview graphics follow the relative displacement of the cursor as shown in FIGS. 35b and 35c. Once the mouse moves over the lower surface 3512 in FIG. 35c, that surface is highlighted and the preview graphics show what will happen when the LMB is released. The preview and the snap to the surface have the advantage of avoiding user confusion while dragging an edge. FIG. 35d shows the result after releasing the LMB. Note the extended edge and the fact that it is attached to the bottom surface. The edge at the bottom surface may be highlighted to be a different color. Finally, the other edge 3535 is dragged down onto the surface 3512. FIG. 35e shows the proper preview showing the edges 3545 and 3540 projected onto the bottom surface 3512. FIG. 35f shows the final result with edge 3547. Extra vertices 3540 are removed from the middle of any straight or curved edges. All vertices involved in the edit must be evaluated to see when they are topologically important. This means, that the edges are at a corner, or a significant change in curvature. If the edges don't meet the above requirements, then those edges should be deleted.

Figures 36A, 36B, 36C, 36D:
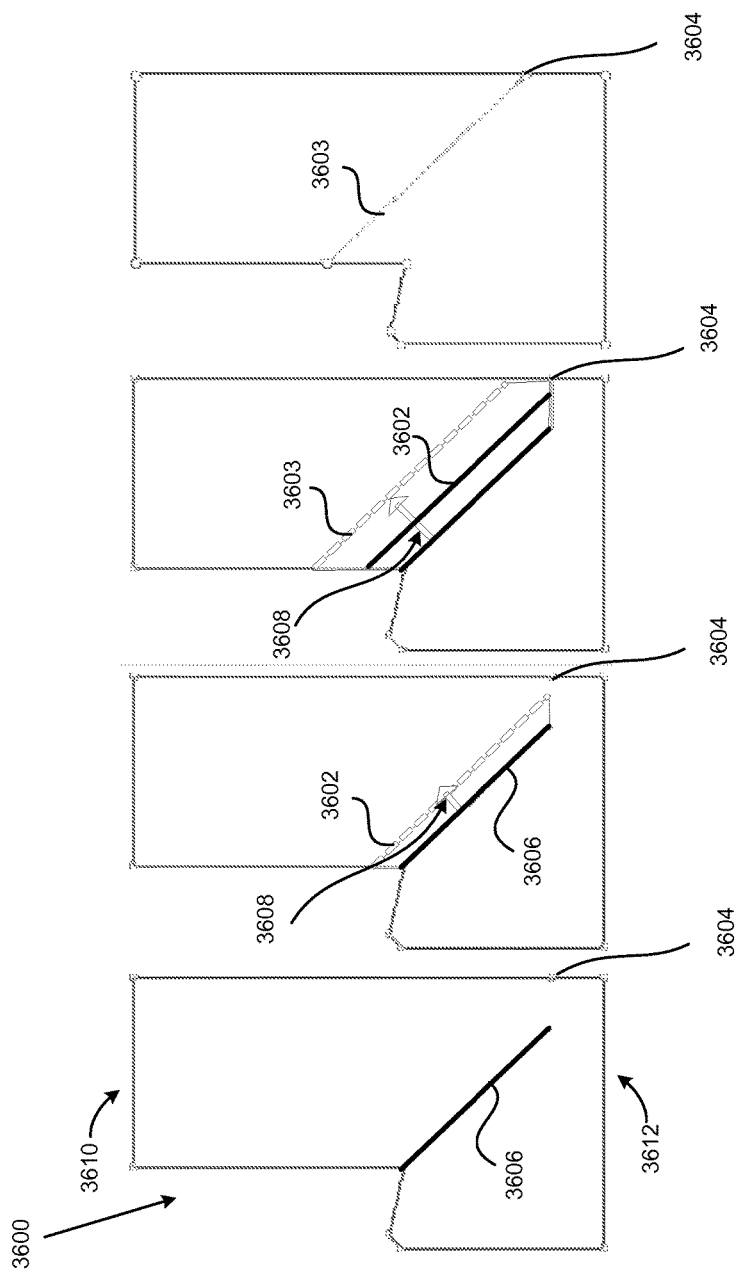
FIGS. 36a-36d are a sequence of displays that illustrate the internal sheet body edge drag behavior.

FIGS. 36a-36d illustrate the internal sheet body edit. When dragging edges that are congruent to other surfaces, the extrude method should be not be activated and the extrapolate method should be supported. This method will move edges internal to sheet bodies in a very useful way to help users improve the meshing topology. In FIG. 36a, surface 3600 includes two surfaces 3610 and 3612 that are connected by an edge 3606. FIG. 36b, edge 3606 is moved in a direction 3608 and an edge 3602 that connects the two surfaces is generated. FIG. 36c shows the edge 3602 being dragged further in direction 3608 into surface 3610. FIG. 36d illustrates the resulting shape with new edge 3603. The length of edge 3602 may be different than the original edge 3606. The orientation of edge 3602 remains the same as shown in FIG. 36a.

FIGS. 37a-37c illustrate another example of the internal sheet body edge edit from FIGS. 36a-36d. In FIGS. 37a-37c a user is dragging edge 3704 to either improve meshing or change the design of the part. Each boundary can represent different properties or materials, such as different composite or ply layers. The surfaces that share the edge will get edited, and the surfaces that share a vertex or vertices will not be edited. In FIG. 37a edge 3706 is moved toward the center of the surface 3702. New edge 3704 may be formed. In FIG. 37b surface 3702 is edited further. Edge 3710 is moved within the surface 3702 in a direction 3716 to create a new edge 3714. FIG. 37c illustrates the resulting shape of surface 3702.

FIGS. 38a-38c illustrate an interaction with internal loops within a sheet body surface 3800. When edges are being dragged into a surface, no matter which method is used, the holes and edges will interact with each other. Hole edges 3807 and 3809 can be dragged to change their location using the translate mode, or their dimensions using extrapolate or extrude modes (hole radius is directly edited for circles and fillets). In FIG. 38a edge 3802 may be dragged to toward the inside of surface 3800. FIG. 38b illustrates edge 3802 being moved in a direction 3806 to new edge 3810. FIG. 38c illustrates new edge 3820 that includes portions of hole edge 3809 and new edge 3810.

The system supports snapping to features while dragging edges. As an edge is being dragged, the user can input a distance, drop the edge at an arbitrary location in the fixed drag path, drag to an edge to trigger edge replace, drag to a surface to trigger an extend to up-to surface behavior, or drag the edge to a point, where the distance to the point will be used as the drag distance. As the mouse approaches a point, edge/curve or surface, once it gets within the snap tolerance, this object will highlight and the 2D graphical feedback show what the boundaries will look like if this feature is used. A pick filter may be required to turn off some object types or all to allow proper control by the user.

While for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus. Alternatively or in addition, the program instructions can be encoded on an artificially generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "system", "logic", "data processing apparatus" or "computing device" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), an internetwork (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. For example, while certain embodiments have been described with respect to searching of a single media type, i.e., image search or video search, one or more embodiments are also relevant to a generic search where the search results are blended with different media types. Thus, for example, a user can type in a keyword search phrase into an Internet search engine and obtains results that contain images, video and other media types blended with text results, and in which relevant matching advertisements are obtained (and provided to the user) that match one or more of these multi-media search results. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A system, comprising at least one computer processor, operably coupled to at least one non-transitory memory storing computer executable instructions, that when executed by the processor, improve modification of a simulated object using an input device of the system by implementing:
   an edge computer system configured to receive user input via the input device to move an edge of the simulated object;
   a collapse determination computer system configured to:
      determine a change in area of a surface associated with the edge, wherein the change in area is caused by moving the edge; and
      remove the area changed and all attributes associated with the area changed in response to determining that the area changed corresponding to the user input is less than a non-zero threshold portion of the simulated object; and
   a visual feedback system configured to display the moved edge.

2. The system of claim 1, wherein moving the edge comprises connecting one edge with another edge.

3. The system of claim 1, wherein removing all attributes associated with the area comprises removing each edge associated with the area changed of the surface.

4. The system of claim 1, wherein the area changed is removed when the area changed approaches zero by connecting the edge with another edge of the surface.

5. The system of claim 1, wherein the threshold portion is one thousandths of a largest size of the simulated object.

6. The system of claim 1, wherein the area changed is removed without increasing or decreasing an area of another surface in the simulated object.

7. The system of claim 1, wherein the edge moved is on an exterior of the simulated object.

8. The system of claim 1, wherein the change in area is determined in response to receiving user input to move the edge.

9. A non-transitory computer-readable medium storing computer-executable instructions, such that when the computer-executable instructions are executed by a processor, causes the processor to improve modification of a simulated object using an input device of the system by:
   receive user input via the input device to move an edge of the simulated object;
   determine a change in area of a surface associated with the edge, wherein the change in area is caused by moving the edge; and
   remove the area changed and all attributes associated with the area changed in response to determining that the area changed corresponding to the user input is less than a non-zero threshold portion of the simulated object; and
   display the moved edge.

10. The non-transitory computer-readable medium of claim 9, wherein the processor moves the edge by connecting one edge with another edge.

11. The non-transitory computer-readable medium of claim 9, wherein the processor removes all attributes associated with the area by removing each edge associated with the area changed of the surface.

12. The non-transitory computer-readable medium of claim 9, wherein the area changed is removed as the area changed approaches zero by connecting the edge with another edge of the surface.

13. The non-transitory computer-readable medium of claim 9, wherein the threshold portion is one thousandths of a largest size of the simulated object.

14. The non-transitory computer-readable medium of claim 9, wherein the area changed is removed without increasing or decreasing an area of another surface in the simulated object.

15. The non-transitory computer-readable medium of claim 9, wherein the edge moved is on an exterior of the simulated object.

16. The non-transitory computer-readable medium of claim 9, wherein the change in area is determined in response to receiving user input to move the edge.

17. A method for improving moving an edge of a simulated object using an input device, the method comprising:
- receiving user input via the input device to move the edge of the simulated object;
- determining a change in area of a surface associated with the edge, wherein the change in area is caused by moving the edge; and
- removing the area changed and all attributes associated with the area changed in response to determining that the area changed corresponding to the user input is less than a non-zero threshold portion of the simulated object; and
- displaying the moved edge.

18. The method of claim 17, wherein moving the edge comprises connecting one edge with another edge.

19. The method of claim 17, wherein the removing all attributes associated with the area comprises removing each edge associated with the area changed of the surface.

20. The method of claim 17, wherein the area changed is removed as the area changed approaches zero by connecting the edge with another edge of the surface.

21. The method of claim 17, wherein the threshold portion is one thousandths of a largest size of the simulated object.

22. The method of claim 17, wherein the area changed is removed without increasing or decreasing an area of another surface in the simulated object.

23. The method of claim 17, wherein the edge moved is on an exterior of the simulated object.

24. The method of claim 17, wherein the change in area is determined in response to receiving user input to move the edge.

25. A system for improving moving an edge of a simulated object using input means, the method comprising:
- the input means for receiving user input to move the edge of the simulated object;
- means for determining a change in area of a surface associated with the edge, wherein the change in area is caused by moving the edge; and
- means for removing the area changed and all attributes associated with the area changed in response to determining that the area changed corresponding to the user input is less than a non-zero threshold portion of the simulated object; and
- means for displaying the moved edge.

* * * * *